United States Patent
Liu et al.

(10) Patent No.: US 6,998,173 B2
(45) Date of Patent: Feb. 14, 2006

(54) CEMENTED CARBIDE TOOL AND METHOD OF MAKING

(75) Inventors: Yixiong Liu, Greensburg, PA (US); Donald A. Botbyl, Greensburg, PA (US); George P. Grab, Greensburg, PA (US); Mark S. Greenfield, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 145 days.

(21) Appl. No.: 10/292,992

(22) Filed: Nov. 13, 2002

(65) Prior Publication Data

US 2003/0126945 A1 Jul. 10, 2003

Related U.S. Application Data

(60) Division of application No. 09/812,217, filed on Mar. 19, 2001, now Pat. No. 6,638,474, which is a continuation-in-part of application No. 09/543,710, filed on Mar. 24, 2000, now abandoned.

(51) Int. Cl.
*B32B 9/00* (2006.01)

(52) U.S. Cl. .................. 428/312.2; 428/469; 428/472; 428/698; 428/699; 428/307.7; 428/318.4; 51/307; 51/309

(58) Field of Classification Search ............... 51/307, 51/309; 428/469, 472, 336, 698, 699, 307.7, 428/312.2, 318.4
See application file for complete search history.

(56) References Cited

U.S. PATENT DOCUMENTS

| | | | |
|---|---|---|---|
| 2,036,245 A | 4/1936 | Walter | |
| 2,612,442 A | 9/1952 | Goetzel | |
| 3,147,542 A | 9/1964 | Boeckeler | |
| 3,564,683 A | 2/1971 | Schedler et al. | |
| 3,640,689 A | 2/1972 | Glaski et al. | |
| 3,684,585 A | 8/1972 | Stroup et al. | |
| 3,717,496 A | 2/1973 | Kieffer et al. | |
| 3,874,900 A | 4/1975 | Post et al. | 117/69 |
| RE28,485 E | 7/1975 | Rix et al. | 29/198 |
| 3,971,656 A | 7/1976 | Rudy | 75/203 |
| 3,999,954 A | 12/1976 | Kolaska et al. | 29/182.7 |
| 4,018,631 A | 4/1977 | Hale | 148/31.5 |
| 4,035,541 A | 7/1977 | Smith et al. | 428/217 |
| 4,049,876 A | 9/1977 | Yamamoto et al. | 428/923 |
| 4,052,530 A | 10/1977 | Fonzi | 428/552 |
| 4,063,938 A | 12/1977 | Weissman | 75/205 |
| 4,101,703 A | 7/1978 | Schintlmeister | 428/216 |
| 4,150,195 A | 4/1979 | Tobioka et al. | 428/548 |
| 4,268,569 A | 5/1981 | Hale | 428/215 |
| 4,276,095 A | 6/1981 | Kolaska et al. | 148/16.6 |
| 4,277,283 A | 7/1981 | Tobioka et al. | 75/238 |
| 4,279,651 A | 7/1981 | Fujimori et al. | 75/233 |
| 4,282,289 A | 8/1981 | Kullander et al. | 428/457 |

(Continued)

FOREIGN PATENT DOCUMENTS

EP 0127416 12/1984

(Continued)

OTHER PUBLICATIONS

English abstract of Japanese Patent Application JP5171442A (Jul. 1993[1 page].

(Continued)

*Primary Examiner*—Archene Turner
(74) *Attorney, Agent, or Firm*—John J. Prizzi

(57) ABSTRACT

A coated cemented carbide tool, and a method for making the same, wherein the as-sintered substrate is formed by sintering in an atmosphere having at least a partial pressure and for a part of the time a nitrogen partial pressure.

30 Claims, 9 Drawing Sheets

U.S. PATENT DOCUMENTS

| | | | |
|---|---|---|---|
| 4,334,928 A | 6/1982 | Hara et al. | 75/238 |
| 4,442,169 A | 4/1984 | Graham | 428/332 |
| 4,463,062 A | 7/1984 | Hale | 428/698 |
| 4,497,874 A | 2/1985 | Hale | 428/551 |
| 4,548,786 A | 10/1985 | Yohe | 419/29 |
| 4,610,931 A | 9/1986 | Nemeth et al. | 428/547 |
| 4,649,084 A | 3/1987 | Hale et al. | 428/552 |
| 4,812,370 A * | 3/1989 | Okada et al. | 428/552 |
| 4,830,930 A | 5/1989 | Taniguchi et al. | 428/547 |
| 4,843,039 A | 6/1989 | Akesson et al. | 501/87 |
| 5,066,553 A | 11/1991 | Yoshimura et al. | 428/698 |
| 5,135,801 A * | 8/1992 | Nystrom et al. | 428/216 |
| 5,181,953 A | 1/1993 | Nakano et al. | 75/237 |
| RE34,180 E | 2/1993 | Nemeth et al. | 428/547 |
| 5,250,367 A * | 10/1993 | Santhanam et al. | 428/472 |
| 5,283,030 A | 2/1994 | Nakano et al. | 419/53 |
| 5,310,605 A | 5/1994 | Baldoni, II et al. | 428/569 |
| 5,370,944 A | 12/1994 | Omori et al. | 428/565 |
| 5,451,469 A | 9/1995 | Gustafson et al. | 428/548 |
| 5,484,468 A | 1/1996 | Ostlund et al. | 75/236 |
| 5,503,925 A | 4/1996 | Nakano et al. | 428/336 |
| 5,549,980 A | 8/1996 | Ostlund et al. | 428/698 |
| 5,585,176 A | 12/1996 | Grab et al. | 428/336 |
| 5,643,658 A | 7/1997 | Uchino et al. | 428/216 |
| 5,648,119 A | 7/1997 | Grab et al. | 427/249 |
| 5,649,279 A | 7/1997 | Gustafson et al. | 419/25 |
| 5,709,907 A | 1/1998 | Battaglia et al. | 427/126.1 |
| 5,722,803 A | 3/1998 | Battaglia et al. | 407/119 |
| 5,729,823 A | 3/1998 | Gustafson et al. | 428/552 |
| 5,761,593 A | 6/1998 | Ostlund et al. | 419/29 |
| 5,858,480 A | 1/1999 | Iio et al. | 427/590 |
| 5,914,181 A | 6/1999 | Uchino et al. | 428/216 |
| 5,955,186 A | 9/1999 | Grab | |
| 6,110,603 A | 8/2000 | Chen et al. | 428/564 |
| 6,299,992 B1 | 10/2001 | Lindskog et al. | |
| 6,468,680 B1 * | 10/2002 | Waldenstrom et al. | 428/698 |

FOREIGN PATENT DOCUMENTS

| | | |
|---|---|---|
| EP | 0200991 | 11/1986 |
| EP | 0337696 | 10/1989 |
| EP | 0560212 | 9/1993 |
| EP | 9317140 | 9/1993 |
| EP | 0569696 | 11/1993 |
| EP | 0603143 | 6/1994 |
| EP | 0682580 | 11/1995 |
| EP | 0737756 | 10/1996 |
| JP | 52110209 | 9/1977 |
| JP | 52156303 | 7/1979 |
| JP | 56009365 | 1/1981 |
| JP | 03082766 * | 4/1991 |
| JP | 03094062 * | 4/1991 |
| WO | 9802394 | 1/1998 |
| WO | 9802395 | 1/1998 |
| WO | 9802396 | 1/1998 |
| WO | 9810119 | 3/1998 |
| WO | 9816664 | 4/1998 |
| WO | 9816665 | 4/1998 |
| WO | 0003047 | 1/2000 |

OTHER PUBLICATIONS

English Abstract of Japanese Patent Application JP56020141A (Feb. 1981) [1 page].

English Abstract of Japanese Patent Application JP3090575A (Apr. 1991) [1 page].

English Abstract of Japanese Patent Application JP309406A (Apr. 1991) [1 page].

Suzuki et al. The β Free Layer Formed Near the Surface of Sintered WC-β-Co Alloy Containing Nitrogen, Nippan Kinzoku Gakkaishi, vol. 45 No. 1 pp. 95-99 (1981).

Taniguchi et al., Properties of Nitrogen Contained Cemented Carbides with a Small Amount of Binder Metal, R&MH pp. 171-176 (Sep. 1986).

Suzuki et al., The βFree Layer Formed Near the Surface of Vacuum Sintered WC-β-Co Alloys Containing Nitrogen, Transactions of the Japan Institute of Metals. vol. 22, No. 11 (1981) pp 758-764.

Doi et al. Thermodynamic Evaluation of Equilibrium Nitrogen Pressure and WC Separation in Ti-W-C-N System Carbonitride, Proceedings of the 11th International Plansee Seminar, Reutte Austria (1985) pp 825-843.

Nemeth et al., The Microstructural Features and Cutting Performance of the High Edge Strength Kennametal Grade KC850, Proceedings of the 10$^{th}$ International Plansee Seminar, Ruette Austria (1981) pp. 613-627.

Yohe, The Development of Cubic-Carbide Free Surfe Layers in Cemented Carbides without Nitrogen, Proceedings of 13$^{th}$ International Plansee Seminar, Reutte, Austria (1993) pp. 151-168.

Gustafson et al., Binder-Phase Enrichment by Dissolution of Cubic Carbides, Int. J. Refractory Metals and Hard Materials. 12 (1993-1994) pp. 129-136.

Schwarzkopf et al., Kinetics of Compositional Modification of (W, Ti)C-WC-Co Alloy Surfaces. Materials Science and Engineering A105/106 (1988) pp. 225-231.

Yohe, The Development of Cubic Carbide Free Surface Layers in Cemented Carbides without Nitrogen, Int J. of Refractory & Hard Materials 12 (1993-1994) pp. 137-144.

Kobori et al. Binder Enriched Layer Formed Near the Surface of cemented carbide, Funtai oyobi Funtai Yakin vol. 34 No. 3 pp. 129-132 (1987).

Santhanam et al., Cemented Carbide, Metals Handbook 16 9$^{th}$ Edition, Machining (1989) pp. 71-89.

Schwarzkopf et al., Nitrogenated Hardmetals for Producing Toughness-increasing Surface zones, 12$^{th}$ International Plansee Seminar, Ruette Austria (1989) pp. 803-831.

International Search Report of Nov. 30, 2001 in PCT/US01/08933.

Communication mailed Feb. 27, 2003 regarding K1753EP Application No. 01 918 869.7-2122.

* cited by examiner

CEMENTED CARBIDE TOOL AND METHOD OF MAKING

CROSS-REFERENCE TO EARLIER PATENT APPLICATION

This application is a devision of Ser. No. 09/812,217 filed Mar. 19, 2001 now U.S. Pat. No. 6,638,474 which is a continuation-in-part to U.S. patent application Ser. No. 09/543,710 filed on Mar. 24, 2000 now ABN for a CEMENTED CARBIDE TOOL AND METHOD OF MAKING by Liu et al.

FIELD OF THE INVENTION

The invention pertains to a method of making a cemented carbide cutting tool, as well as the cemented carbide cutting tool itself.

BACKGROUND OF THE INVENTION

There are cemented carbide (e.g., tungsten carbide-based materials with a cobalt binder) cutting inserts that exhibit a surface zone of non-stratified binder enrichment such as disclosed in U.S. Pat. No. 4,610,931 (and U.S. Reissue Pat. No. 34,180) to Nemeth et al. and U.S. Pat. No. 5,955,186 to Grab.

U.S. Pat. No. 4,548,786 to Yohe discloses a process for making a cemented carbide cutting insert with surface binder enrichment wherein a dewaxed blank that does not contain nitrogen is exposed during the heating process to an atmosphere with a nitrogen partial pressure. PCT Patent Publication No. 98/16665 to Lindskog et al. discloses a cemented carbide cutting insert with surface binder enrichment which uses a nitrogen atmosphere for a part of the process. European Patent No. 0 569 696 to Uchino et al. pertains to a cemented carbide cutting insert that contains zirconium and/or hafnium and has a zone of surface binder enrichment underneath the cutting edge. European Patent No. 0 603 143 to Gustafson et al. discloses a method for producing a coated cemented carbide with a zone of stratified binder enrichment that includes sintering a compacted body containing nitrogen in an inert atmosphere (or a vacuum) followed by a cooling at a specific rate.

Kennametal KC850 grade coated cutting insert (KC850 is a registered trademark of Kennametal Inc. of Latrobe, Pa., USA, for cutting inserts) has a zone of stratified binder enrichment. The Nemeth et al. article entitled "The Microstructural Features and Cutting Performance of the High Edge Strength Kennametal Grade KC850", Proceedings of Tenth Plansee Seminar, Reutte, Tyrol, Austria, Metalwerke Plansee A.G. (1981), pages 613–627 describes the Kennametal KC850 grade cutting insert. The article by Kobori et al. entitled "Binder Enriched Mayer Formed Near the Surface of Cemented Carbide", Funtai oyobi Funtai Yakin, Vol. 34, No. 3, pages 129–132 (1987) describes stratified binder enrichment.

Other articles discuss the occurrence of a zone of binder enrichment in cemented carbides. These articles include Schwarzkopf et al., "Kinetics of Compositional Modification of (W,Ti)C—WC—Co Alloy Surfaces", *Materials Science and Engineering*, A105/106 (1988) pages 225–231, Gustafson et al., "Binder-Phase Enrichment by Dissolution of Cubic Carbides", *Int. J. of Refractory Metals & Hard Materials*, 12 (1993–1994), pages 129–136, Suzuki et al., "The B-Free Layer Formed Near the Surface of Sintered WC—B—Co Alloy Containing Nitrogen", *Nippon Kinzoku Gakkaishi*, Vol. 45, No. 1 (1981), pages 95–99, and Suzuki et al., "The B-Free Layer Formed Near the Surface of Vacuum-Sintered WC—B— Co Alloys Containing Nitrogen", *Transactions of the Japan Institute of Metals*, Vol. 22, No. 11 (1981), pages 758–764.

While some of the above articles, patents and products disclose or comprise cutting inserts that exhibit adequate performance, there remains a need to develop processes that produce products (and the products themselves) that have better properties. In this regard, it would be desirable to provide a process (and the resultant product) that sinters the blank in an atmosphere most always having at least a partial pressure so as to be able to control the depth of the zone of binder enrichment. Such a process would provide for an optimum balance between the edge strength and the deformation resistance of the substrate. Such a process would also provide for excellent consistency in the depth of the zone of binder enrichment for the parts throughout a heat.

It would also be desirable to provide a process, as well as the resultant product, wherein there is no carbon precipitation in the zone of binder enrichment, especially in a substrate that has a core porosity of greater than C00 according to ASTM Designation B276-91 (Reapproved 1996). The absence of such carbon precipitation would enhance the adhesion of the coating to the substrate.

It would be advantageous to provide an as-sintered cemented carbide that exhibits a surface zone of non-stratified binder enrichment (or essentially non-stratified binder enrichment which means that most of the binder enrichment is of the non-stratified type with a slight (or small) amount of stratified binder enrichment) wherein there is enhanced solid-solution hardening. In this regard, a cemented (cobalt) tungsten carbide substrate that has nitrogen atoms present at the interstices of the cobalt atoms facilitates solid-solution hardening. The enhancement of solid-solution hardening is especially true for a substrate that with a bulk region that exhibits a porosity of greater than C00 according to ASTM Designation B276-91 (Reapproved 1996). In such a case, the atomic radius of nitrogen (about 0.75 Angstroms) is smaller than the atomic radius of carbon (about 0.91 Angstroms).

It would be advantageous for applying a coating, and especially a coating that contains nitrogen (e.g., titanium nitride or titanium carbonitride), directly on the surface of a substrate that contains nitrogen. In the case of the application of a coating of titanium nitride on the surface of a substrate that has bulk region with a porosity of not greater than C00 according to ASTM Designation B276-91 (Reapproved 1996), the presence of nitrogen would promote nucleation of titanium nitride. In the case of the application of titanium carbonitride to the surface of a substrate with a bulk region exhibiting a porosity of greater than C00 according to ASTM Designation B276-91 (Reapproved 1996), the presence of carbon and nitrogen would help promote the nucleation of titanium carbonitride.

It is believed that with the presence of additional nitrogen in the cobalt binder for a cemented (cobalt) tungsten carbide substrate that has a surface zone of cobalt enrichment, there is an increase in the chemical affinity between the substrate and a nitrogen-containing coating, such as, for example, titanium nitride or titanium carbonitride. It is believed that such an increase in the chemical affinity should lead to an increase in the adhesion of the coating to the substrate.

It is believed that an increase in the availability of nitrogen in the cobalt near the surface of the substrate should reduce the potential for the formation of a brittle eta phase at the interface between the coating and the substrate. The reduction in the potential to form eta phase permits the use of substrates that have lower carbon contents.

It is believed that a higher nitrogen content in the substrate should also result in a decrease in the grains size of the tungsten carbide. An increase in the N/(C+N) content should lead to a decrease in the grain size of the tungsten carbide. The tungsten carbide phase content in the microstructure should increase to a maximum as the N/(C+N) ratio increases.

It can thus be seen that there is a belief that it would be advantageous to provide an as-sintered cemented (cobalt) tungsten carbide substrate that has a higher nitrogen content. The higher nitrogen content should increase adhesion strength between the coating (especially a coating such as titanium nitride and titanium carbonitride) and the substrate. The higher nitrogen content in the cobalt binder near the surface of the substrate should reduce the potential for the formation of brittle eta phase at the coating-substrate interface. The higher nitrogen content should decrease the grain size of the tungsten carbide.

Typically, it has been necessary to use different compositions of the starting powder to produce either an as-sintered substrate that exhibits a surface zone of binder enrichment or an as-sintered substrate in which there is an absence of a surface zone of binder enrichment. As can be appreciated, there is an increase in the cost associated with storing (and/or making) two or more different compositions of starting powder as compared with the cost of storing (and/or making) only one composition of starting powder. From a production viewpoint, it would advantageous to provide a process that would utilize a single starting powder composition to selectively produce either an as-sintered substrate of a commercial quality with a surface zone of binder enrichment or an as-sintered substrate of a commercial quality that does not have a surface zone of binder enrichment.

SUMMARY OF THE INVENTION

In one form, the invention is a coated cutting insert that includes a tungsten carbide-based substrate with rake and flank surfaces and a cutting edge at their intersection. The substrate, which has a porosity rating according to ASTM Designation B276-91 (Reapproved 1996) of greater than C00, has a surface zone of non-stratified binder enrichment that does not exhibit any carbon precipitation. There is a coating on at least a part of the substrate.

In another form thereof, the invention is a method of making a coated tungsten carbide-based cutting insert wherein starting powders are mixed, pressed into a green blank which is then dewaxed. The dewaxed blank is subjected to a sinter heating step, a sinter holding step and a controlled cooling step wherein all of these steps occur in their entirety in an atmosphere that has a partial pressure and for at least a part of the duration of the sinter heating step and the sinter holding step the atmosphere contains a nitrogen partial pressure. The as-sintered substrate is then coated with one or more layers.

In still another form thereof, the invention is a cemented (cobalt) tungsten carbide-based substrate made by sintering a mass of compacted powders in an atmosphere that contains at least a partial pressure. The substrate has rake and flanks surfaces that have a cutting edge at their intersection. The substrate has a zone of non-stratified cobalt enrichment that is adjacent to and extends inwardly from the cutting edge and at least one of the rake and flank surfaces toward the bulk substrate, which has a porosity of greater than C00. The zone of cobalt enrichment does not exhibit any carbon precipitation and has a maximum cobalt content between about 125 and about 300 percent of the bulk cobalt content.

In yet another form thereof, the invention is a made by sintering a compacted mass of starting powders in an atmosphere having at least a partial pressure wherein the starting powders containing the following components: cobalt, tungsten, carbon, titanium, niobium and tantalum, the substrate comprising: a peripheral surface defined by a rake surface, a flank surface, and a cutting edge at the intersection of the rake and flank surfaces; the substrate having a zone of non-stratified cobalt enrichment beginning adjacent to and extending inwardly from the cutting edge and at least one of the rake surface and the flank surface toward a bulk region, the bulk region having a porosity according to ASTM Designation B276-91 (Reapproved 1996) of greater than C00; the zone of cobalt enrichment being at least partially depleted of the solid solution carbides and/or solid solution carbonitrides; the zone of cobalt enrichment not exhibiting any carbon precipitation; and the zone of cobalt enrichment having a cobalt content between about 125 percent and about 300 percent of the cobalt content of the bulk region.

In still another form thereof, the invention is a coated cutting insert that comprises a substantially fully dense substrate made by sintering a compacted mass of starting powders in an atmosphere containing a nitrogen partial pressure. The starting powders include the following components: a binder selected from one or more of cobalt, nickel, iron and their alloys wherein the binder is present between about 3 weight percent and about 12 weight percent, up to about 95 weight percent tungsten, up to about 7 weight percent carbon, and up to about 13 weight percent of one or more of the following components: titanium, tantalum, niobium, hafnium, zirconium, and vanadium. The substrate has a rake surface and a flank surface, and there is a cutting edge being at the intersection of the rake and flank surfaces. The substrate has a zone of non-stratified binder enrichment of a generally uniform depth beginning adjacent to and extending inwardly from the cutting edge and at least one of the rake surface and the flank surface toward a bulk region. The zone of binder enrichment has a high nitrogen content, and the bulk region of the substrate has a high nitrogen content. There is a coating on the cutting edge and at least a portion of one or both of the rake surface and the flank surface of the substrate.

In another form thereof, the invention is a method of making a coated cemented carbide cutting insert comprising the steps of: blending starting powders to form a starting powder mixture wherein the powders contain the following components: a binder selected from one or more of cobalt, nickel, iron and their alloys, tungsten, carbon, and one or more of the following: titanium, tantalum, niobium, hafnium, zirconium, and vanadium; pressing the starting powder mixture to form a green cutting insert blank; dewaxing the green cutting insert blank to form a dewaxed cutting insert blank; sinter heating the dewaxed cutting insert blank from about the maximum dewaxing temperature to at least a pore closure temperature in an atmosphere having a first nitrogen partial pressure for substantially the entire sinter heating step so as to form a pre-sintered cutting insert blank; sinter holding the pre-sintered cutting insert blank at a sinter hold temperature in an atmosphere having a second nitrogen partial pressure for substantially the entire sinter holding step to form a sintered cutting insert blank wherein the second nitrogen partial pressure is greater than the first nitrogen partial pressure; cooling the sintered cutting insert blank from the sintering temperature to a target temperature below the eutectic temperature so as to form an as-sintered cutting insert substrate having a peripheral surface with a zone of non-stratified binder enrichment beginning adjacent to and extending inwardly toward a bulk region of the substrate; and coating the as-sintered cutting insert substrate with a coating comprising one or more layers including a base layer on the surface of the substrate, and the base layer comprising a material containing nitrogen.

In still yet another form thereof, the invention is a method of selectively making either as as-sintered substrate that exhibits a surface zone of binder enrichment or an as-sintered substrate that does not exhibit a surface zone of binder enrichment, the method comprising the steps of: blending starting powders with an effective amount of nitrogen being absent and containing a binder alloy selected from one or more of cobalt, nickel, iron and their alloys, tungsten, carbon, and one or more of the following: titanium, tantalum, niobium, hafnium, zirconium, and vanadium; pressing the starting powder mixture to form a green cutting insert blank; dewaxing the green cutting insert blank to form a dewaxed cutting insert blank; sinter heating the dewaxed cutting insert blank from the maximum dewaxing temperature to at least a pore closure temperature in an atmosphere having a first nitrogen partial pressure for substantially all of the entire sinter heating step so as to form a pre-sintered cutting insert blank; sinter holding the pre-sintered cutting insert blank at a sinter hold temperature in an atmosphere having a second nitrogen partial pressure for substantially the entire sinter holding step as to form a sintered cutting insert blank and wherein the second nitrogen partial pressure may selectively be either greater than equal to or less than the first nitrogen partial pressure; cooling the sintered cutting insert blank from the sintering temperature to a target temperature below the eutectic temperature so as to form an as-sintered cutting insert substrate wherein when the second nitrogen partial pressure is greater then the first nitrogen partial pressure the as-sintered cutting insert substrate does not exhibit a surface zone of binder enrichment and when second nitrogen partial pressure is equal to or less than the first nitrogen partial pressure the as-sintered cutting insert substrate exhibits a surface zone of binder enrichment; and coating the as-sintered cutting insert substrate with a coating comprising one or more layers.

BRIEF DESCRIPTION OF THE DRAWINGS

The following is a brief description of the drawings which form a part of this patent application.

DETAILED DESCRIPTION OF THE INVENTION

Figure 1:
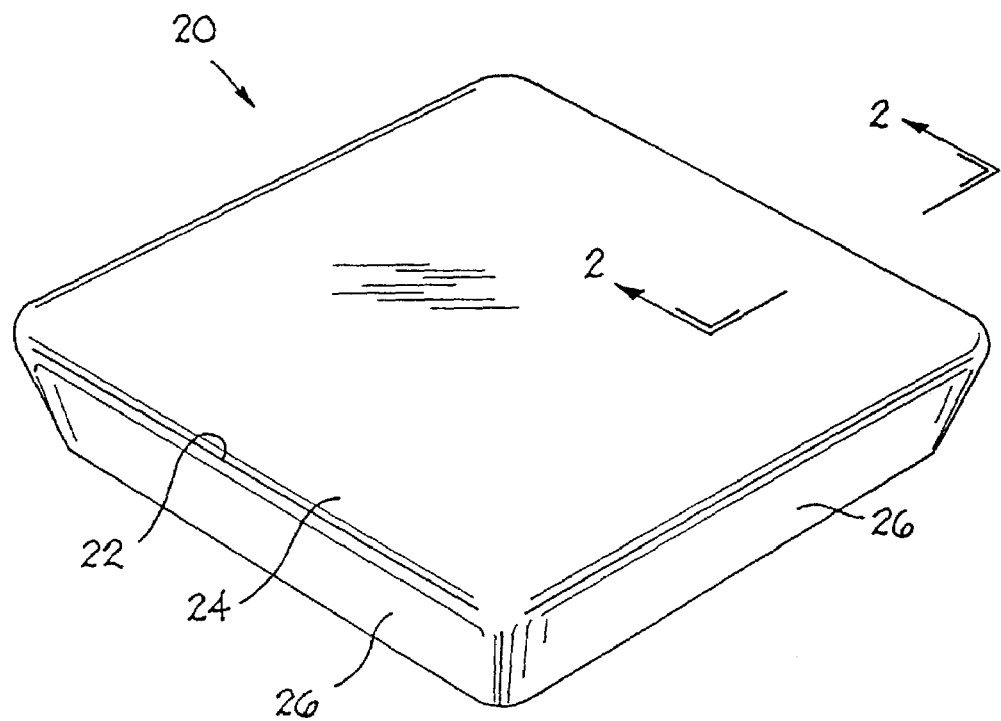
FIG. 1 is an isometric view of a specific embodiment of an SPGN 432 style of cutting insert.

Referring to the drawing figures, FIG. 1 illustrates a specific embodiment of an indexable cutting insert generally designated as 20. Cutting insert 20 has cutting edges 22 at the juncture (or intersection) of the rake face 24 and the flank faces 26. Although the cutting insert shown in FIG. 1 is an SPGN 432 style of cutting insert with a honed cutting edge, applicants contemplate that the present invention includes other styles of cutting inserts with or without honed cutting edges.

Figure 2:
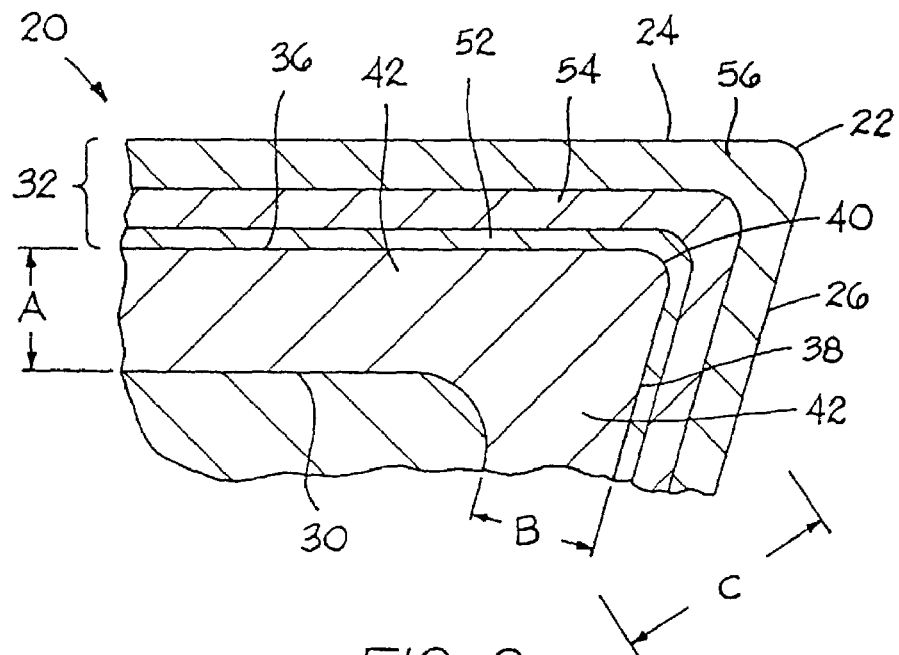
FIG. 2 is a cross-sectional view of the cutting insert of FIG. 1 taken along section line 2—2 of FIG. 1.

As illustrated in FIG. 2, the two basic components of the cutting insert 20 are the substrate 30 and the coating 32 wherein the coating 32 (as shown by brackets) may comprise one or more layers. The substrate 30 has a rake surface 36 and flank surface 38 that intersect to form a substrate cutting edge (or corner) 40. The rake surface 36 and the flank surfaces 38 comprise the peripheral surfaces of the substrate 30. The substrate 30 has a zone of binder enrichment 42 which begins at the peripheral surfaces thereof and extends inwardly from the rake surface 36 a distance "A" (see FIG. 2) and from the flank surface 38 a distance "B". Although in the specific embodiment of FIGS. 1 and 2 the zone of binder enrichment extends from the peripheral surface, applicants contemplate that in some circumstances the zone of binder enrichment may extend inwardly beginning near (but not at [e.g., slightly below]) the peripheral surface of the substrate.

In the specific embodiment of FIGS. 1 and 2 the distances "A" and "B" are essentially about equal, but depending upon the application the magnitude of the distances "A" and "B" may not always be equal. The zone of binder enrichment extends inwardly from the cutting edge a distance "C" which is illustrated as being greater than either distance "A" or distance "B"; however, applicants contemplate that this may not always be the case. In other circumstances the distances "A" and "B" each may be greater than distance "C" or one or the other of the distances "A" and "B" may be greater than distance "C".

The zone of binder enrichment 42 may comprise either a non-stratified type of binder enrichment or an essentially non-stratified type of binder enrichment. Essentially non-stratified binder enrichment means that the majority of the enrichment is of the non-stratified type with a slight presence of stratified binder enrichment. The non-stratified type of binder enrichment is generally homogeneous in nature. Non-stratified binder enrichment is in distinction to stratified binder enrichment in which the binder forms as layers one on top of the other. Stratified binder enrichment is a subject of discussion in the earlier-mentioned Kobori et al. article and Nemeth et al. article each one of which is hereby incorporated by reference herein.

In a preferred embodiment, the substrate 30 is a tungsten carbide-based cemented carbide material containing at least about seventy weight percent tungsten carbide, and more preferably, at least about eighty weight percent tungsten carbide. The binder is preferably cobalt or a cobalt alloy; however, the binder may comprise iron and/or nickel and their alloys. When the binder is cobalt (or a cobalt alloy), the preferably cobalt concentration for the bulk substrate, i.e., the cobalt concentration in the bulk region of the substrate, is between about three weight percent and about twelve weight percent. The more preferably cobalt concentration for the bulk substrate is between about five weight percent and about eight weight percent. Even more preferably, the cobalt concentration for the bulk substrate is between about 5.6 weight percent and about 7.5 weight percent. It should be appreciated that the specific cobalt content of the cutting insert will depend upon the specific application for the cutting insert.

The substrate 30 most preferably also contains solid solution carbides and/or solid solution carbonitrides. More specifically, solid solution carbide and/or solid solution carbonitride forming elements (e.g., titanium, tantalum, niobium, hafnium, zirconium, vanadium) form these solid solutions with each other and/or tungsten. The more preferable elements for forming solid solution carbides and/or solid solution carbonitrides are titanium, tantalum, and niobium. It is preferred that the sum of the tantalum content and the niobium content is between about three weight percent and about seven weight percent, and the titanium content-is between about 0.5 weight percent and about five weight percent. Most preferably, the sum of the tantalum content and the niobium content is between about 5.0 weight percent and about 5.9 weight percent, and the titanium content is between about 1.7 weight percent and about 2.3 weight percent.

In one specific embodiment the starting powder mixture does not contain any effective amount of nitrogen wherein an effective amount of nitrogen is the minimum amount of nitrogen that will cause any measurable (or perceivable) amount of binder enrichment to occur. Hence, for this embodiment the sole source of the nitrogen for the formation of any carbonitrides during the sintering process, and possibly present in the as-sintered substrate 30, comes from the nitrogen in the atmosphere to which the substrate is exposed during the sintering process. However, as described hereinafter another specific embodiment contains nitrogen in the starting powder mixture.

In the zone of binder enrichment, the solid solution carbides and/or carbonitrides have been wholly, or in some cases partially, depleted so that the tungsten carbide and the cobalt comprises the majority (and in some cases all) of the composition of the zone of binder enrichment. It is generally thought that a lower level of solid solution carbides and/or carbonitrides results in an increase in the edge strength (or toughness).

The zone of binder enrichment also typically does not contain any free carbon in that there is an absence of any carbon flakes (i.e., carbon penetration or carbon precipitation) in the zone of binder enrichment. The presence of carbon precipitation in the zone of binder enrichment may result in poor adhesion of the coating to the substrate so that the absence of carbon precipitation is desirable.

In the zone of binder enrichment, the binder (e.g., cobalt or a cobalt alloy) concentration preferably should reach a maximum value that is between about one hundred twenty-five percent and about three hundred percent of the binder concentration in the bulk region of the substrate, i.e., the bulk substrate. A more preferably range of the maximum level of binder concentration in the zone of binder enrichment is between about one hundred fifty percent and about three hundred percent of the binder concentration in the bulk substrate. The most preferable range of the maximum level of binder concentration in the zone of binder enrichment is between about two hundred weight percent and about two hundred fifty weight percent of the binder concentration in the bulk substrate.

The zone of binder enrichment preferably begins at and extends inwardly from the peripheral surface(s) of the substrate. However, in some cases, there may be a thin layer adjacent to the peripheral surface(s) in which the binder concentration has been reduced (or even eliminated) due to binder evaporation. In such a case, the zone of binder enrichment begins near the peripheral surface and extends inwardly therefrom. Applicants consider that the characterization that the zone of binder enrichment begins adjacent to the surface(s) means that the zone of binder enrichment begins either at or near the surface(s).

The thickness of the zone of binder enrichment may extend inwardly beginning at or near the peripheral surface (e.g., the rake surface, the flank surface, and/or the cutting edge) a distance up to about fifty micrometers. One preferred range of the thickness of the zone of binder enrichment is between about five micrometers and about fifty micrometers. A more preferred range is between about ten micrometers and about forty micrometers. The most preferred range is between about twenty micrometers and about thirty micrometers. In the selection of the preferred depth of the zone of binder enrichment one typically balances the deformation resistance and the edge strength of the substrate. The edge strength increases, but the deformation resistance decreases, with an increase in the depth of the zone of binder enrichment.

It is desirable to be able to provide a process for making the as-sintered cutting insert substrate by which one may control the thickness of the zone of binder enrichment. By varying the process parameters (e.g., the magnitude of the nitrogen partial pressure in the atmosphere, the temperature, the duration) in conjunction with the composition of the starting powders one may control the depth of the zone of binder enrichment both at the flat surfaces (e.g., the rake surface and the flank surface) and at the cutting edge(s) of the as-sintered cutting insert substrate.

By controlling the process parameters, one may also control the depth of the zone of binder enrichment. It is also believed that control of the process parameters should control the content of nitrogen in the substrate. By controlling the nitrogen content one should be able to provide a substrate that has a desirably high nitrogen content in the bulk region thereof and a desirably high nitrogen content in the surface zone of binder enrichment thereof.

As illustrated in FIGS. 1 and 2, bonded onto the peripheral surface of the substrate is a hard coating 32 that has three layers. These layers comprise the base layer 52 applied directly to the peripheral surface of the substrate, the intermediate layer 54 applied to the surface of the base layer 52 and the outer layer 56 applied directly to the surface of the intermediate layer 54. Although FIG. 2 illustrates that each one of these layers is of a different thickness, it should be appreciated that applicants contemplate that the thickness of each layer, the specific number of layers, and the composition of each layer may vary depending upon the specific application for the cutting insert.

One preferred coating scheme comprises a 4.5 micrometer thick base layer of titanium carbonitride applied to the surface of the substrate, an 8.5 micrometer thick mediate layer of alumina (alpha) applied to the surface of the base layer, and a 1.5 thick outer layer of titanium carbonitride and titanium nitride applied to the surface of the mediate layer wherein all of the above layers are applied by chemical vapor deposition (CVD). Another preferred coating scheme comprises a base layer of titanium nitride that is 0.5 micrometers thick applied by CVD to the surface of the substrate, a 7 micrometer thick layer of titanium carbonitride applied by moderate temperature chemical vapor deposition (MT-CVD) to the surface of base layer, a 0.5 micrometer thick layer of titanium carbonitride applied by CVD to the surface of the MT-CVD layer of titanium carbonitride, a 4 micrometer thick layer of alumina (kappa) applied by CVD to the surface of the CVD titanium carbonitride layer, and a 1 micrometer thick outer layer of titanium nitride applied by CVD to the surface of the alumina layer.

In addition to the above compositions exemplary compositions for these layers include titanium aluminum nitride applied by physical vapor deposition (PVD), titanium diboride applied by PVD, titanium carbide, and other materials suitable for use as a coating for cutting inserts. These coating layers may be applied by one or more known techniques that include, without limitation, PVD, CVD and/or MT-CVD techniques.

As illustrated in FIG. 2, for a cutting insert 20 used in milling applications it is preferred that the zone of binder enrichment 42 extend inwardly from the rake surface 36 and the flank surfaces 38 of the substrate 30. The zone of binder enrichment 42 is generally parallel to the rake surface 36 and the flank surfaces 38 of the substrate. The zone of binder enrichment also extends inwardly from the cutting edge 40 of the substrate.

In other material removal applications, such as, for example, turning, it is preferred that the zone of binder enrichment is present only at the rake surface of the substrate, i.e., the zone of binder enrichment only extends inwardly beginning at or near the rake surface of the cutting insert substrate. In such a case, it is typical that the zone of binder enrichment has been removed by grinding (or the like) from the other surfaces (e.g., the flank surface) of the cutting insert substrate after completion of the consolidation process.

Figure 3:
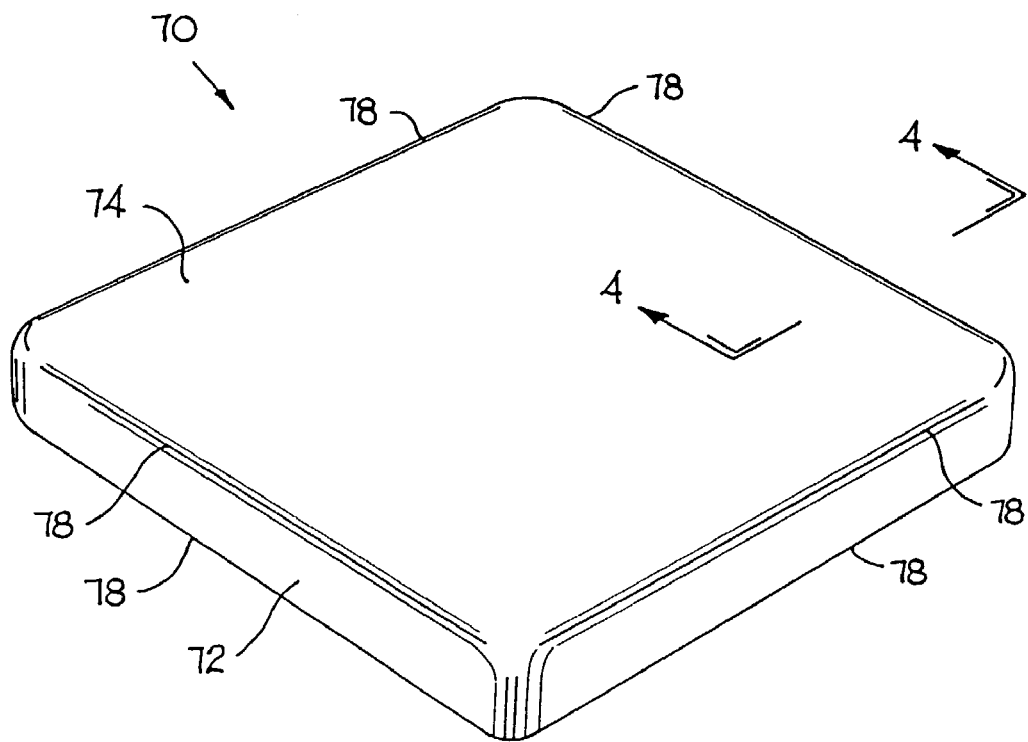
FIG. 3 is an isometric view of a specific embodiment of an SNG 433 style of cutting insert.
Figure 4:
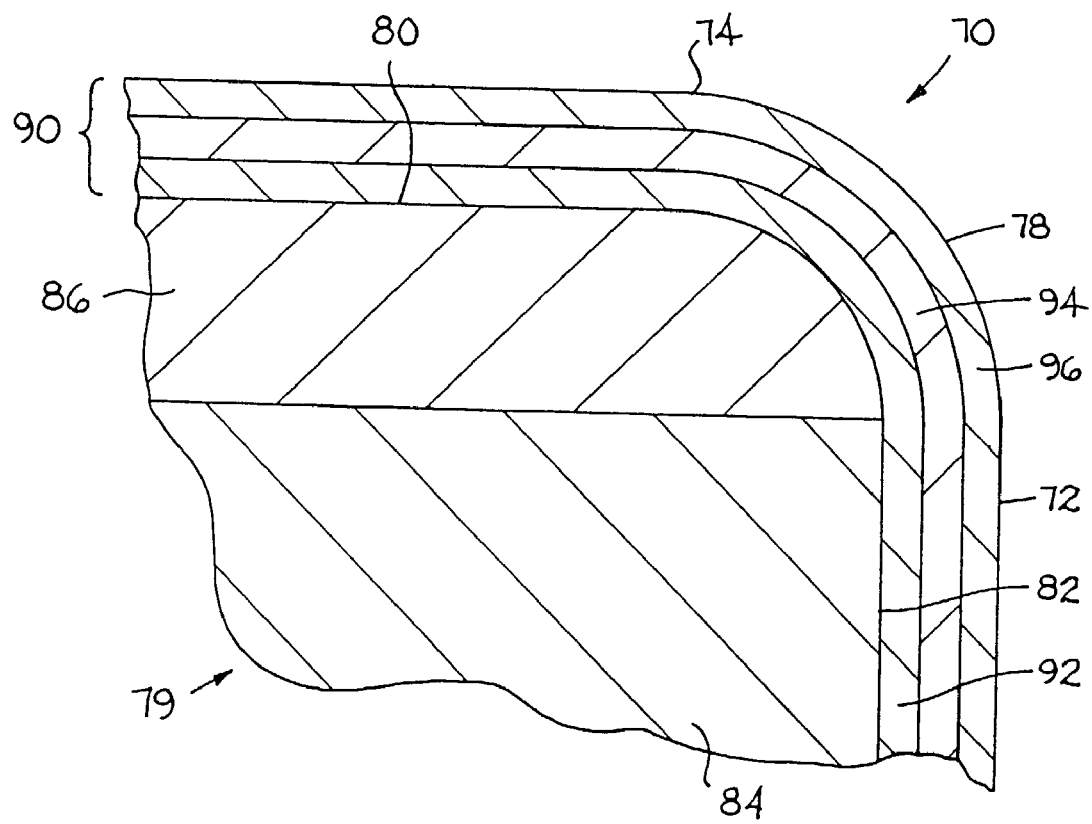
FIG. 4 is a cross-sectional view of the cutting insert of FIG. 3 taken along section line 4—4 of FIG. 3.

Referring to FIGS. 3 and 4, cutting insert generally designated as 70 has four flank faces 72 which intersect with one (top) rake face 74 and another (bottom) rake face to form eight cutting edges 78. Cutting insert 70 has a substrate generally designated as 79 (see FIG. 4) with a peripheral surface wherein the peripheral surface includes a rake surface 80 and a ground flank surface 82. Substrate 79 has an interior bulk region 84 which comprises a majority of the volume of the substrate 79. The substrate 79 further has a zone of binder enrichment 86 that extends inwardly from the rake surface 80 of the substrate 79. Any zone of binder enrichment is absent from any portion of the bulk region near the flank surfaces 82.

The substrate 79 for the cutting insert 70 is essentially of the same composition as the composition of the substrate 30 of the first embodiment of the cutting insert 20. The levels of binder enrichment in the zone of binder enrichment 86 are essentially the same as those levels of binder enrichment that are in the zone of binder enrichment 42 of the first embodiment of the cutting insert 20. The basic coating scheme, which is shown in brackets 90, is essentially the same as the coating scheme 32 for the first embodiment of the cutting insert 20 so as to have a base layer 92, an intermediate layer 94, and an outer layer 96.

Applicants do not intend to be held to, or limited by, the discussion of the following scientific theory that may be applicable to his invention. Applicants believe that the depth of the zone of binder enrichment may be predicted, and hence controlled, by taking into consideration the composition of the starting powder and along with the other processing parameters (e.g., temperature and duration of the hold) providing an atmosphere having a predetermined nitrogen partial pressure(s) for the various stages of the sintering process which includes the sinter heating, the sinter holding and the controlled cooling steps. The magnitude of the nitrogen partial pressure in the atmosphere for each stage may be determined through a calculation using Gibbs free energies. The calculation determines of the equilibrium nitrogen partial pressure necessary to either permit nitrogen diffusion into the blank or nitrogen evolution out of the blank. By providing an atmosphere having a nitrogen partial pressure per the calculation, applicants have been able to control the amount of nitrogen that enters the blank during the sinter heating stage of the sintering process, as well as control the extent the nitrogen evolves from the blank during the sinter holding and controlled cooling stages of the sintering process, so as to essentially control the depth of the zone of binder enrichment in the as-sintered cutting insert substrate. A brief discussion of the formulas used to make the above calculation now follows.

Referring to the fundamental basics of the calculation where for all formulas (1) through (8) "T" is the temperature in degrees Kelvin, formula (1) set forth below expresses the change in the Gibbs free energy for the reaction of $2TiN = 2Ti + N_2$:

$$\Delta G_1° = 161700 - 45.54T. \quad (1)$$

Formula (2) set forth below expresses the change in the Gibbs free energy for the reaction $TiC = Ti + C$:

$$\Delta G_2° = 44600 - 3.14T. \quad (2)$$

The combination of these above two reactions and two formulas results in formula (3) below for the change in Gibbs free energy of the reaction $2\,TiC + N_2 = 2\,TiN + 2C$ to be as follows:

$$\Delta G_3° = -72500 + 39.22T \quad (3)$$

The following formula (4) expresses the condition when the reaction $2\,TiC + N_2 + 2\,TiN + 2C$ reaches equilibrium:

$$\Delta G_3° = -RT \cdot lnK_p = -RT \cdot \ln([a_C]^2 \cdot [a_{TiN}]^2)/([a_{N2}] \cdot [a_{TiC}]^2), \quad (4)$$

where $K_p$ is the equilibrium constant, $a_i$ is the activity of the "i" component. The data for $\Delta G°$ are taken from the text by Kubaschewski et al. entitled "Metallurgical Thermo-Chemistry", 5th Edition, Pergamon Press (1979).

Making the approximation that $(a_{TiN})/(a_{TiC}) = 1$ and that $R = 2$ calories/K·mol and equating equations (3) and (4) above, one arrives at equation (5) set forth below:

$$-72500 + 39.22T = -2T \cdot lnK_p = -2T \cdot \ln(a_c{}^2/a_{N2}) \quad (5)$$

From equation (5) above one obtains the following equation (6):

$$K_p = a_c^2/a_{N2} = \exp[(72500/2T)-(39.22/2)] \quad (6)$$

In light of the following formula (7):

$$a_{N2} = P°_{N2}/P(=1 \text{ atm.}) = P°_{N2} \text{ [units are atmospheres]}$$

The following formula (8) thus expresses the equilibrium partial pressure:

$$P°_{N2} = a_c^2/K_p \quad (8)$$

What this means is that at a specific temperature, one may calculate the equilibrium constant $K_p$. The carbon activity, $a_c$, is a variable in the cemented carbide blank that is subjected to sintering, but ranges between about 0.3 and about 1. By calculating the equilibrium nitrogen partial pressures ranging over temperatures between the maximum dewaxing temperature to the sinter hold temperature, the formation and depth of the zone of binder enrichment may be controlled so that the process produces an as-sintered cutting insert substrate with a zone of binder enrichment of a pre-selected depth.

The process typically comprises the following processing steps.

First, the powder mixture is thoroughly blended (or mixed) together along with a fugitive binder by a process such as ball milling. In one embodiment the starting powder does not contain an effective amount of nitrogen. In another embodiment the starting powder contains an effective amount of nitrogen typically added as an additive such as titanium nitride. The powder blend is then pressed into a green cutting insert blank. The green cutting insert blank has partial density (e.g., about fifty-five percent) and open porosity.

Next, the green cutting insert blank is subjected to a dewaxing (or delubing) step by heating (typically in an atmosphere with a hydrogen partial pressure or sometimes in an atmosphere with a positive hydrogen pressure) from ambient temperature to a maximum dewaxing temperature so as to evaporate the fugitive binder from the blank and thereby form a dewaxed cutting insert blank. In this patent application the term "partial pressure" means a pressure of less than one atmosphere and the term "positive pressure" means a pressure of greater than one atmosphere. Although these parameters may vary, a typical heating rate is 2.78 degrees Centigrade per minute and a typical maximum dewaxing temperature is about 450 degrees Centigrade.

As an optional next step, the dewaxed cutting insert blank may undergo a hold (e.g., ten minutes in duration) under a vacuum at the maximum dewaxing temperature.

The next step is to subject the dewaxed cutting insert blank to a sinter heating step by heating the blank at a typical rate of 2.78 degrees Centigrade per minute from the maximum dewaxing temperature, past the temperature where the blank exhibits closure of the continuous porosity, and to the maximum sintering temperature which typically is about 1483 degrees Centigrade. Although the specific parameters depend upon the composition of the starting powders (and especially the carbon level and the extent, if any, to which there is nitrogen therein) all, or possibly part of, the sinter heating step occurs for a predetermined duration through a pre-selected temperature range in an atmosphere with a selected nitrogen partial pressure. The nitrogen partial pressure may typically range between about fifteen torr and about seventy torr; however, too high of a nitrogen partial pressure may cause too much nitrogen gas to diffuse into the blank so as to adversely affect the ability to achieve a closed continuous porosity. As a result of the sinter heating step, the dewaxed cutting insert blank is transformed into a pre-sintered cutting insert blank that contains nitrogen, which typically is a pre-selected amount of nitrogen.

Applicants believe that by heating the dewaxed cutting insert blank in an atmosphere with a nitrogen partial pressure, nitrogen is able to diffuse into the dewaxed cutting insert blank so long as there is both open porosity and a favorable nitrogen concentration gradient between the blank and the atmosphere so as to permit such diffusion. As the sinter heating step continues under nitrogen partial pressure the nitrogen continues to diffuse throughout the mass of the cutting insert blank. By the time the temperature reaches the point where there is closure of continuous open porosity in the blank, the nitrogen content is generally uniform throughout the mass of the pre-sintered cutting insert blank.

In the embodiment where an effective amount of nitrogen is absent from the starting powders essentially all of the nitrogen contained in the pre-sintered cutting insert blank comes from the atmosphere of the sinter heat step. In the embodiment where the starting powder mixture contains an effective amount of nitrogen, only some of the nitrogen contained in the pre-sintered cutting insert blank comes from the atmosphere of the sinter heat step. Typically, the nitrogen forms solid solution carbonitrides with the carbonitride-forming elements such as titanium, tantalum, niobium, zirconium, hafnium and vanadium that may be in the pre-sintered cutting insert blank wherein titanium, tantalum and niobium are the preferred carbonitride-forming elements.

When the starting powder mixture contains nitrogen it is possible that the atmosphere during the sinter heating step may not contain any nitrogen partial pressure or may only have a nitrogen partial pressure for a part of this step. However, the atmosphere should have a partial pressure throughout the sinter heating step so as to not permit the uncontrolled evolution of nitrogen from the blank.

One may also be able to control the depth of the surface zone of binder (cobalt) enrichment by varying the ramp rate of the sinter heating step. Typically, a decrease in the ramp rate during the sinter heating step when done under a nitrogen partial pressure increases the depth of the surface zone of binder enrichment. An increase in the ramp rate during the sinter heating step when done under a nitrogen partial pressure typically decreases the depth of the surface zone of binder (cobalt) enrichment.

After completion of the sinter heating step, the pre-sintered cutting insert blank is subjected to a sinter holding step wherein the blank is held at the maximum sintering temperature for a predetermined duration. For all, or at least a part, of the sinter holding step the atmosphere contains a nitrogen partial pressure. During the sinter holding step the nitrogen in the pre-sintered cutting insert blank evolves from the blank. The nitrogen evolution is thought to facilitate the formation of the zone of binder enrichment beginning at (or near) the peripheral surface of the blank and extending inwardly toward the bulk substrate.

The duration of the sinter holding step, the maximum sintering temperature, the magnitude of the nitrogen partial pressure during the sinter heating step, and the magnitude of the nitrogen partial pressure during the sinter holding step each can play a role in controlling the depth of the zone of binder enrichment. The result of the sinter holding step is a sintered cutting insert blank that exhibits a zone of non-stratified binder enrichment of a controlled depth.

By controlling the parameters of the sinter heating step and the sinter holding step, it is believed that one may also control the nitrogen concentration in the bulk region and the surface zone of binder enrichment of the substrate, as well as control the depth of the surface zone of binder enrichment. As mentioned herein, it is applicants' belief that the presence of nitrogen in the surface zone of binder (cobalt) enrichment provided certain advantages.

As an option, applicants contemplate that once the pre-sintered cutting insert blank reaches a liquid phase stage during the sinter holding step, the blank may be subjected to a pressure sinter process or hot isostatic pressing (HIPping).

After completion of the sinter holding step, the sintered cutting insert blank experiences a controlled cooling step at a specific cool down rate from the maximum sintering temperature to a target temperature below the eutectic temperature. During the controlled cooling step the atmosphere should not be a vacuum, but should have a partial pressure of a gas such as argon or nitrogen so that there is not any uncontrolled evolution of nitrogen. However, it is preferable that during all or part of the controlled cooling step the atmosphere contain a nitrogen partial pressure that is typically the same as the nitrogen partial pressure during the sinter holding step. A typical cool down rate is about 1.0 degree Centigrade per minute, a typical eutectic temperature is about 1316 degrees Centigrade, and a typical target temperature is about 1150 degrees Centigrade wherein the target temperature is at the end of the controlled cooling step.

Applicants believe that during the controlled cooling step little or no nitrogen evolves from the substrate so that there should not be a change in the depth and magnitude of the zone of binder enrichment. Applicants also believe that the slower cooling rate (e.g., about 1.0 degree Centigrade per minute) permits the uniform diffusion of carbon in the zone of binder enrichment so that there is no precipitation of carbon (i.e., carbon penetration) in the zone of binder enrichment. The result of the controlled cooling step is an as-sintered substantially fully dense cutting insert substrate.

Next, there is a furnace cooling step in which the substantially fully dense cutting insert substrate is furnace cooled to ambient temperature. A typical atmosphere for furnace cooling is helium.

In some instances the as-sintered fully dense cutting insert substrate is ground on one or more surfaces (or areas) so as to remove the zone of binder enrichment. Again, depending upon the circumstances the ground substrate may be subjected to a heat treatment such as vacuum-sintering or sintering, i.e., resintering, in an atmosphere with at least a partial pressure such as a nitrogen partial pressure. For some styles of cutting inserts the resintered cutting insert substrate may have at least a portion of one or more surfaces (e.g., the flank surface) ground.

The as-sintered cptting insert substrate or the ground (or ground resintered or ground-resintered-ground) substrate is typically coated with a wear resistant coating to form a coated cutting insert. The coating process may any one or a combination of known techniques including CVD, PVD and MTCVD. The coating itself may contain one or more layers of varying compositions as identified hereinabove.

The present invention is further described by the following examples. These examples are provided solely for the purpose of description. These examples are not intended to restrict or limit the scope of the invention since the true spirit and scope of the invention are indicated by the claims set forth hereinafter.

For all of the examples that exhibit a microstructure that has a zone of surface binder enrichment it should be appreciated that the zone of binder enrichment was essentially free of any solid solution carbides and any solid solution carbonitrides so that tungsten carbide and cobalt were essentially the only components of the zone of binder enrichment. In addition, there was no free carbon, i.e., carbon penetration or carbon precipitation, in the zone of the binder enrichment.

EXAMPLE NO. 1

For Example No. 1, the starting powder mixture contained the following components: 6 weight percent cobalt, 2.7 weight percent tantalum, 2.0 weight percent titanium, 0.8 weight percent niobium and the balance of the starting powder mixture was tungsten and carbon wherein the carbon was adjusted to a level of 6.18 weight percent. The starting powder mixture did not contain any nitrogen, except possibly in small trace amounts. These trace amounts were sufficiently small so that the starting powder did not contain any effective amount of nitrogen wherein the nitrogen (even if present) in the starting powder did not assist in any measurable (or perceivable) way in the formation of the zone of binder enrichment.

Five kilograms (kg) of the powder mixture charge for Inventive Example No. 1 were added to a 7.5 inch inside diameter by 9 inch steel mill jar along with 21 kilograms of $5/16$ th inch diameter cemented carbide cycloids. Heptane was added to the top of the jar so that the jar was completely full. The mixture was rotated for forty hours at fifty-two revolutions per minute (rpm) at ambient temperature. The slurry from the charge was then emptied from the jar and dried, paraffin added as a fugitive binder, and the powders were granulated so as to provide for adequate flow properties. These granulated powders were then pressed into SNG433 style green cutting (turning) insert blanks, i.e., a compacted mass of starting powders, which exhibited partial density as well as open porosity.

The green cutting insert blanks were heated (or dewaxed) under a partial pressure of hydrogen gas from ambient temperature to about 450 degrees Centigrade to form dewaxed cutting insert blanks. During the dewaxing step, the fugitive binder evaporated from the green cutting insert blanks.

The dewaxed cutting insert blanks were held at about 450 degrees Centigrade for ten minutes in a vacuum.

Following the vacuum-hold step there was a sinter heating step in which flowing nitrogen gas was introduced so that the atmosphere had a nitrogen partial pressure of about 70 torr for the entire time that the dewaxed cutting insert blanks were heated at a rate of about 2.78 degrees Centigrade per minute from about 450 degrees Centigrade to the maximum sintering temperature of about 1483 degrees Centigrade. The dewaxed cutting insert blanks were transformed into pre-sintered cutting insert blanks.

A sinter holding step followed the sinter heating step. At the start of the sinter holding step the nitrogen partial pressure was reduced to about 15 torr and the temperature was maintained at about 1483 degrees Centigrade for a period of about 90 minutes. The pre-sintered cutting insert blanks were transformed into as-sintered cutting insert blanks wherein these blanks exhibited substantially full density.

A controlled cooling step followed the sinter holding step. In the controlled cooling step, the nitrogen partial pressure remained at about 15 torr and the as-sintered cutting insert blanks were cooled at a rate of about 1.0 degrees Centigrade per minute until reaching a temperature of about 1150 degrees Centigrade which was below the eutectic temperature of about 1315 degrees Centigrade.

The next step was a furnace cooling step under a helium partial pressure in which the as-sintered cutting insert blanks were permitted to furnace cool to ambient temperature 38 degrees Centigrade. The resultant product of the above processing steps was an as-sintered cutting insert substrate.

Figure 5:
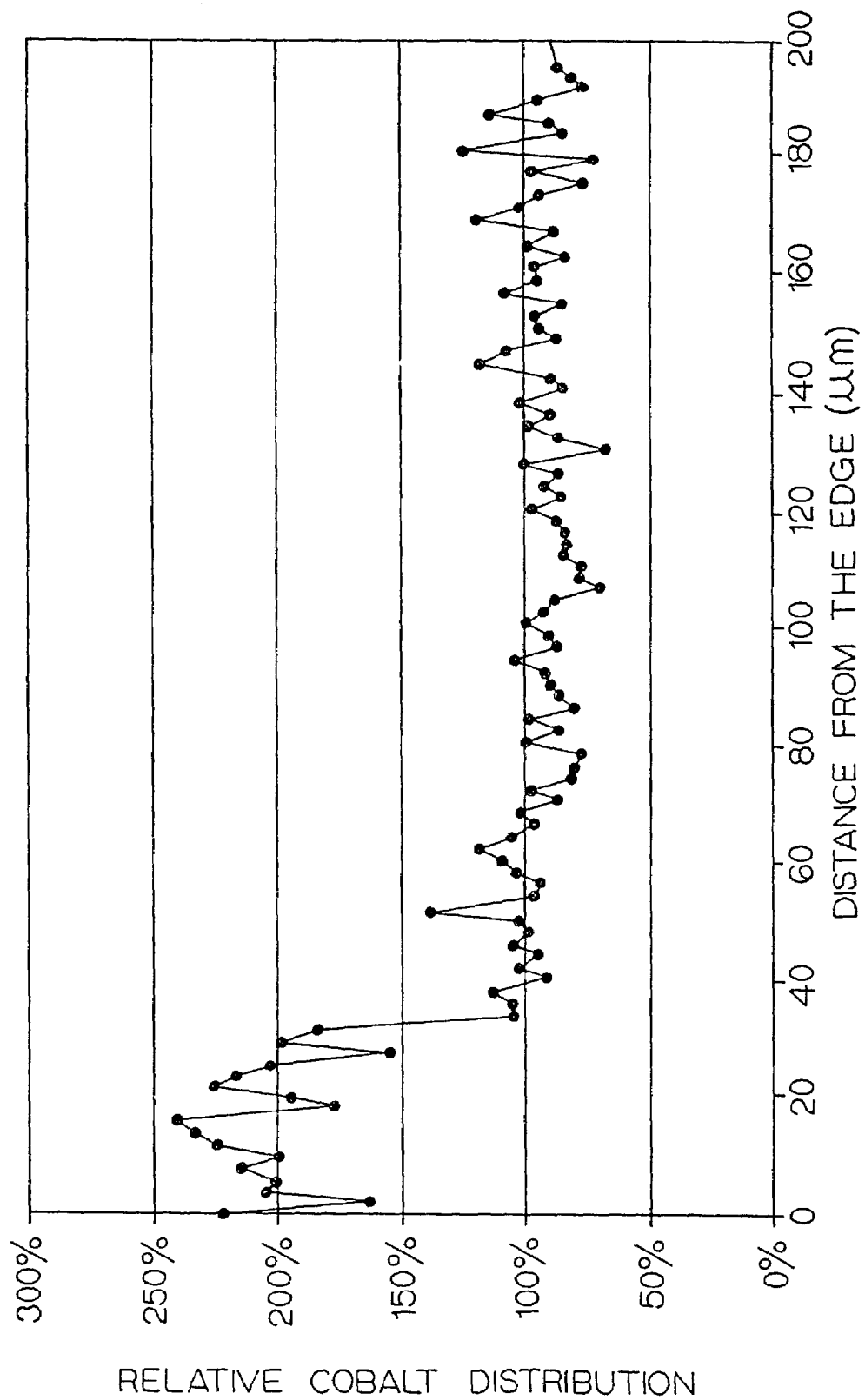
FIG. 5 is a cobalt profile showing the cobalt concentration relative to the bulk cobalt concentration as measured by an energy dispersive x-ray line scan analysis (EDX) technique at selected distances in micrometers from the peripheral surface of the as-sintered cutting insert substrate made according to Example No. 1 hereof.
Figure 6:
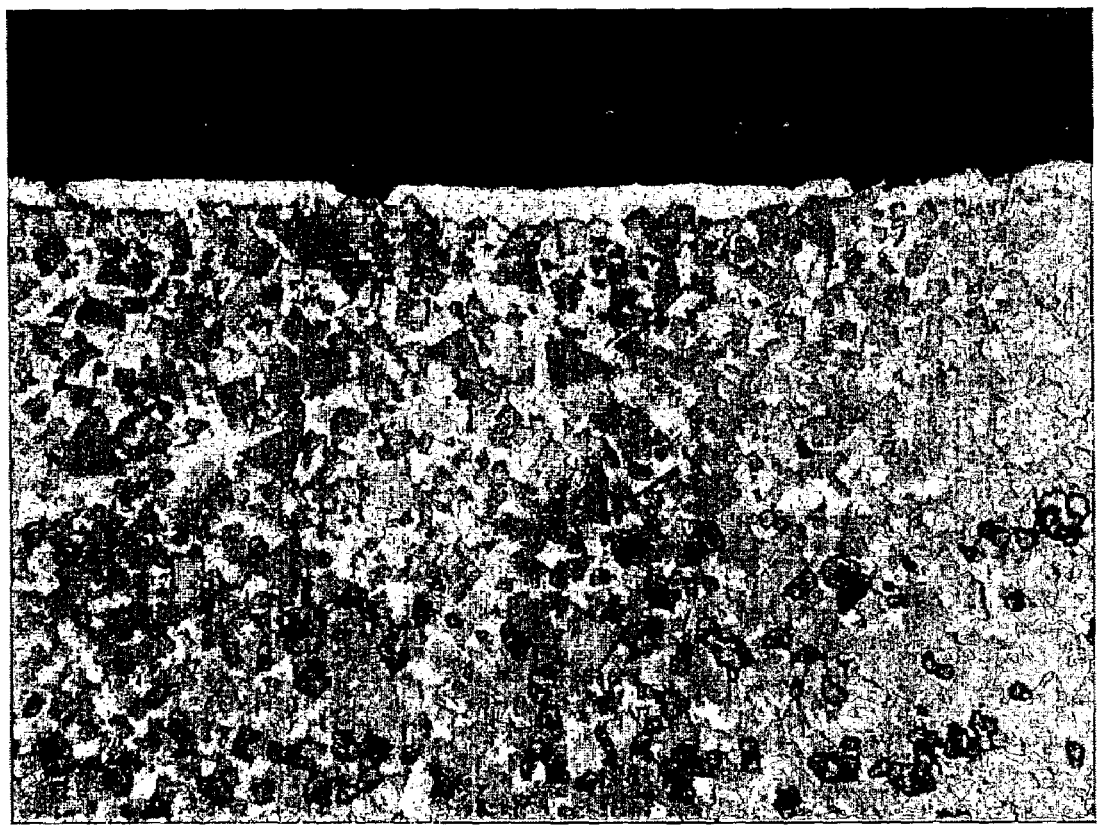
FIG. 6 is a photomicrograph (at a magnification of 1500×) showing the microstructure near the surface of the as-sintered cutting insert substrate made according to Example 1 hereof.

As shown in FIG. 5 and FIG. 6, the microstructure of the as-sintered cutting insert substrate exhibited a zone of essentially non-stratified binder enrichment beginning at and extending inwardly from a peripheral surface of the substrate for a distance of about thirty micrometers. In this regard, most all of the enrichment is of the non-stratified type of binder enrichment and there is a slight amount of the stratified type of binder enrichment. Referring to the cobalt profile of FIG. 5, the maximum level of cobalt concentration in the zone of binder enrichment was between about 200 percent and about 250 percent of the cobalt concentration of the bulk substrate. Referring to the photomicrograph of FIG. 5, the porosity rating for the zone of binder enrichment was C00. The porosity rating for the bulk substrate was C02.

Figure 8:
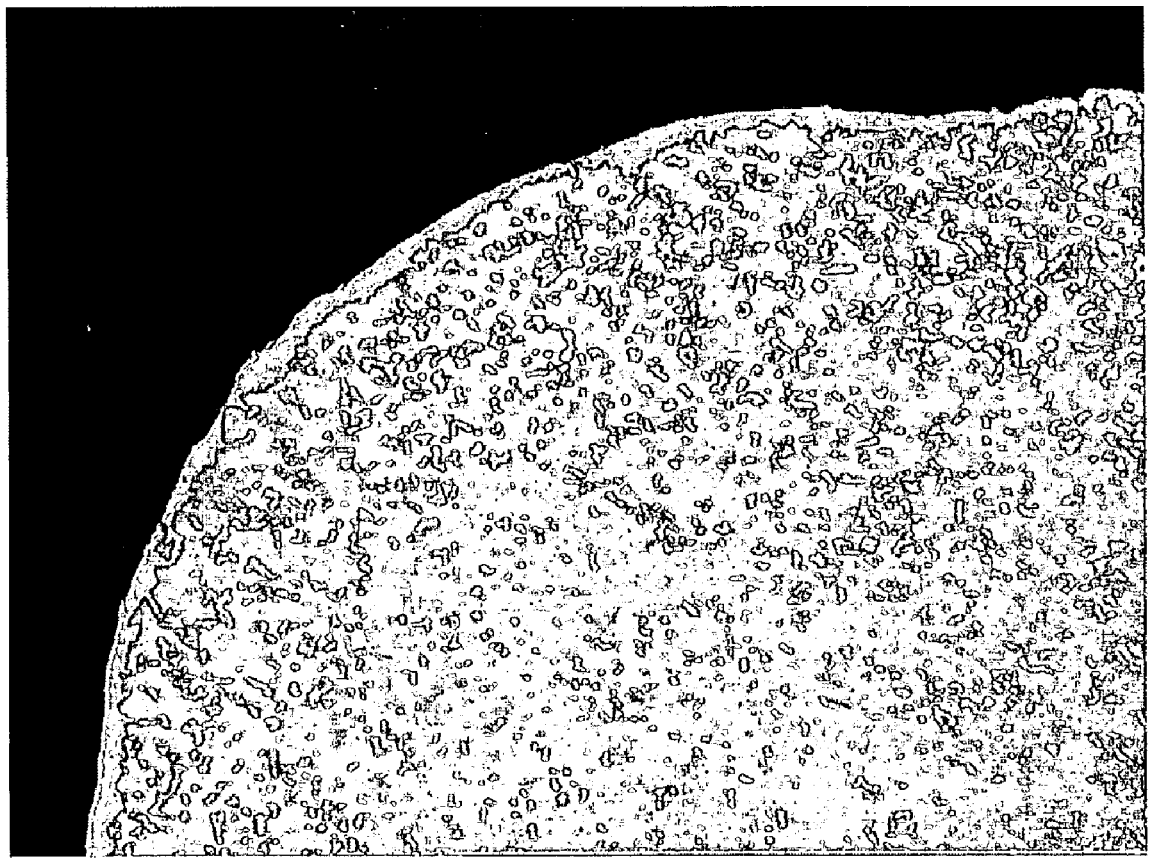
FIG. 8 is a photomicrograph (at a magnification of 1200×) showing the microstructure at the corner of an as-sintered cutting insert substrate made according to Example 1.
Figure 9:
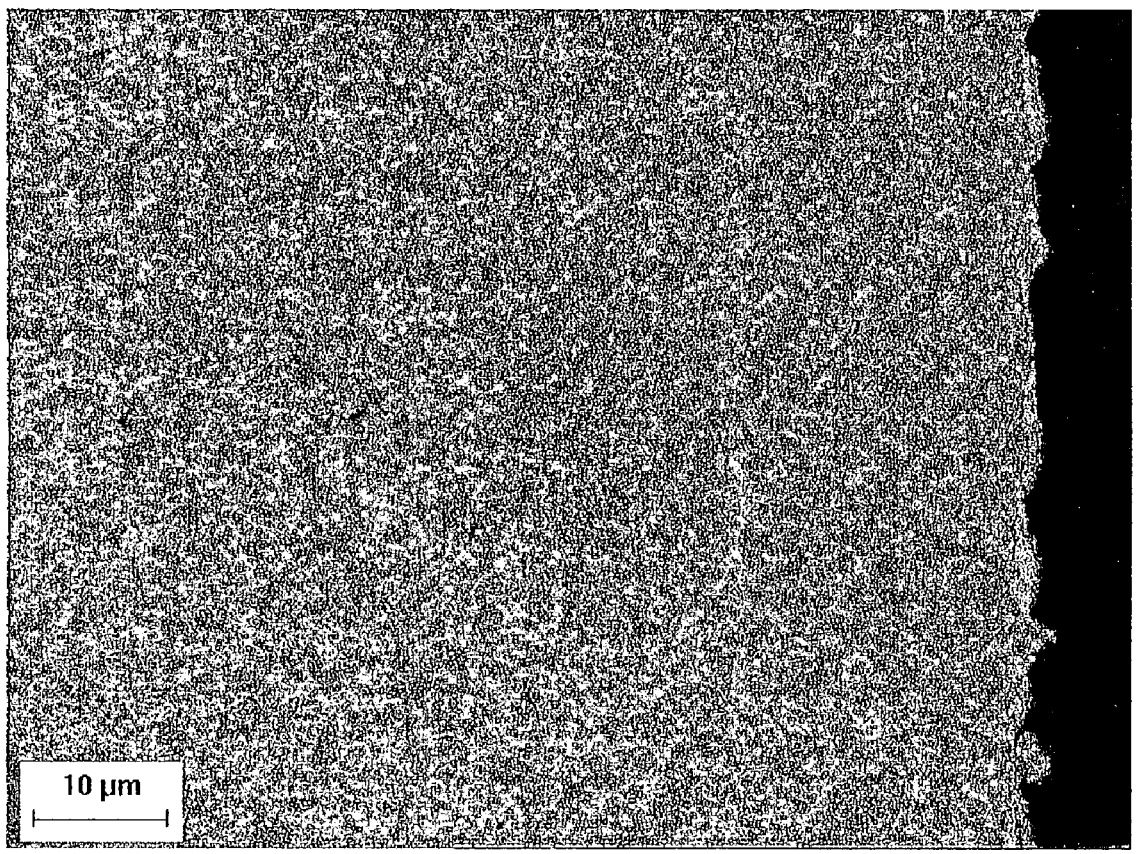
FIG. 9 is a photomicrograph, which has a distance indicator of 10 micrometers showing the microstructure near the surface of the as-sintered cutting insert substrate made according to Example X207-1 hereof.
Figure 10:
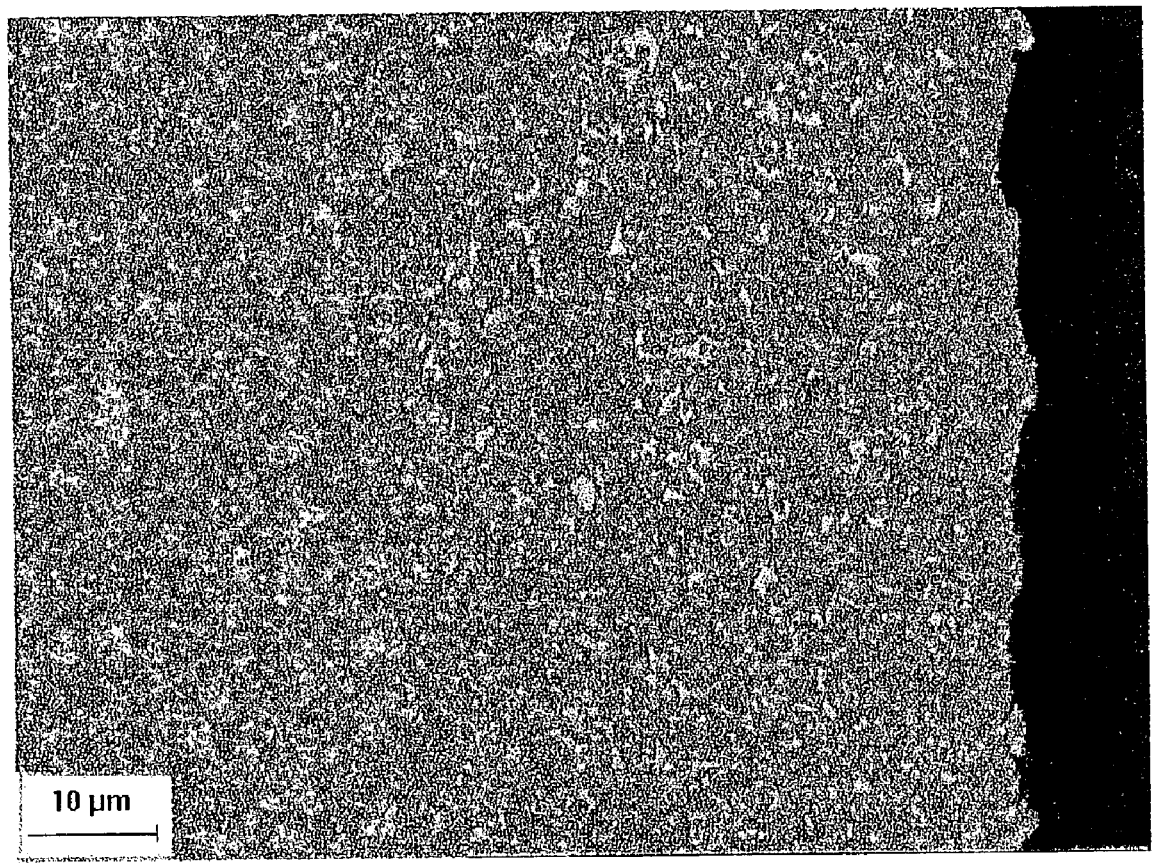
FIG. 10 is a photomicrograph, which has a distance indicator of 10 micrometers showing the microstructure near the surface of the as-sintered cutting insert substrate made according to Example X207-2 hereof.
Figure 11:
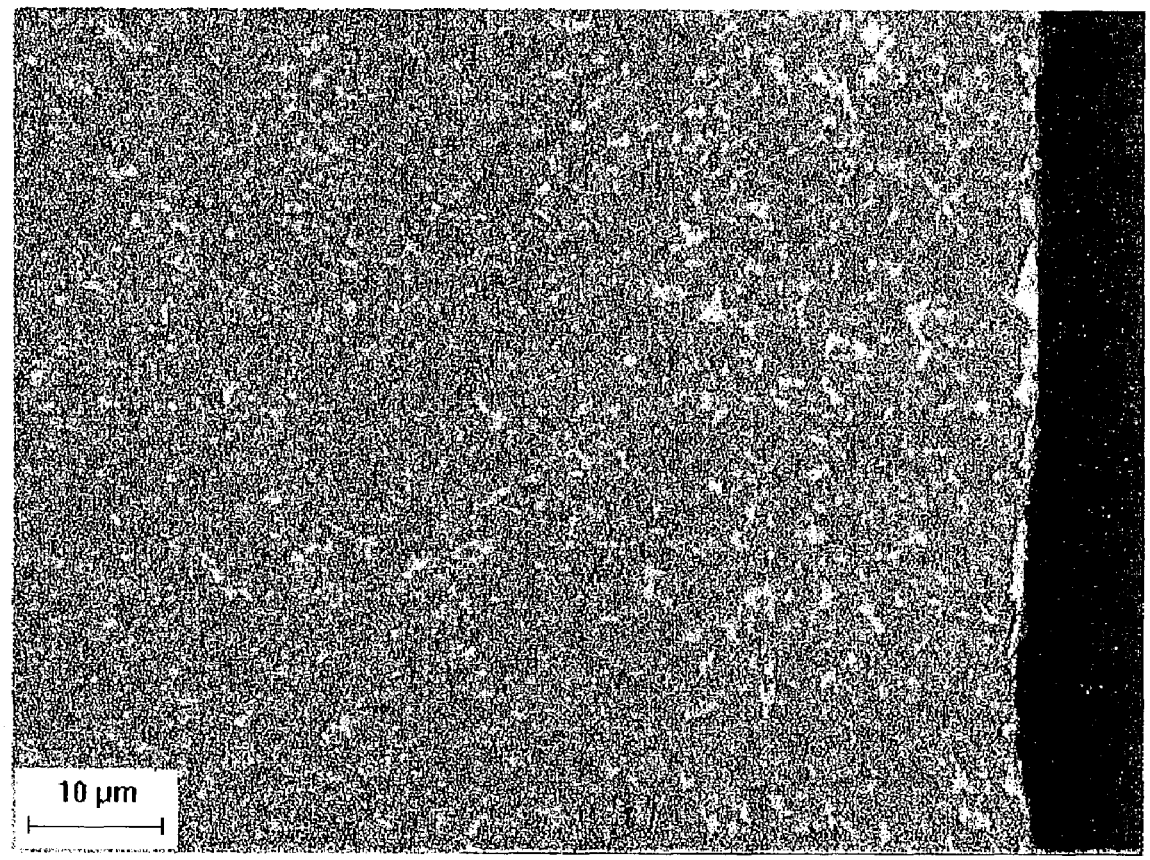
FIG. 11 a photomicrograph, which has a distance indicator of 10 micrometers showing the microstructure near the surface of the as-sintered cutting insert substrate made according to Example X207-3 hereof.

As shown in FIG. 8, the microstructure at the corner of an as-sintered cutting insert substrate made according to the step of Example 1 exhibited a zone of essentially non-stratified binder (i.e., cobalt) enrichment beginning at and extending inwardly from the corner of the substrate a distance of about 20 micrometers. Even though the specific substrate shown in FIG. 8 is not the exact same substrate represented by FIGS. 5 and 6, applicants expect that the maximum level of cobalt concentration in the zone of binder enrichment should be between about 200 percent and 250 percent of the bulk cobalt content.

EXAMPLE NO. 1A

A powder mixture of the same composition as Example No. 1 was prepared, pressed and processed in the same way as Example No. 1, except that during the controlled cooling step the nitrogen partial pressure was at 70 torr. An analysis showed that there was a zone of essentially non-stratified binder enrichment beginning at the peripheral surface of the substrate and extending inwardly to a depth of about twenty-nine micrometers. The apparent porosity of the zone of binder enrichment was C00 and of the bulk substrate was C02.

EXAMPLE NO. 2

For Example No. 2, green cutting insert blanks were pressed from the same powder mixture as Example No. 1 into SNG432 style green cutting insert blanks. The processing steps were the same as those used to process Example No. 1, except that the sinter hold step had a duration of about forty-five minutes. The depth of the zone of essentially non-stratified binder enrichment was about twenty-three micrometers and the maximum level of cobalt concentration in the zone of binder enrichment was between about 200 percent and about 250 percent of the cobalt concentration of the bulk substrate. The porosity rating for the zone of binder enrichment was C00 and the bulk substrate was C02.

EXAMPLE NO. 2A

A powder mixture the same as the powder mixture of Example No. 2 was prepared and processed in the same way as Example No. 2, except that the controlled cooling step was done at a nitrogen partial pressure of 70 torr. There was a zone of essentially non-stratified binder enrichment beginning at and extending inwardly from the surface of the substrate to a depth of about twenty-three micrometers. The apparent porosity of the zone of the binder enrichment was C00 and of the bulk substrate was C02.

EXAMPLE NOS. 3, 3A and 3B

For Example Nos. 3, 3A and 3B the green cutting insert blanks were pressed from a powder mixture like the powder mixture of Example No. 1. The green cutting insert blanks were processed like the process of Example No. 1, except that the nitrogen atmosphere was kept at 70 torr during the sinter heat step, the sinter hold step, and the controlled cool down step. For Examples 3, 3A and 3B, each one of these as-sintered cutting insert substrates had a zone of essentially non-stratified binder enrichment that began at and extended inwardly from the peripheral surface toward the bulk substrate to a depth) of about 10, 10 and 10.4 micrometers, respectively. For each one of the substrates the porosity rating for the zone of binder enrichment was C00 and for the bulk substrate was C02.

EXAMPLES NOS. 3C and 3D

A powder mixture of the same composition as Example No. 3 was prepared and processed the same as Example No. 3, except that the controlled cooling rate was 11.1 degrees Centigrade per minute. Examples Nos. 3C and 3D exhibited a zone of binder enrichment that began at and extended inwardly form the peripheral surface to a depth of ten micrometers and thirteen micrometers, respectively. For each example the apparent of the zone of binder enrichment was C00 and the porosity of the bulk substrate was C02.

EXAMPLE NO. 6

For Example No. 6, the same powder mixture as Example 1 was processed in the same way as Example 1 to achieve an as-sintered cutting insert substrate. The as-sintered cutting insert substrate was ground so that the rake surface and the flank surfaces presented as-ground surfaces. The ground as-sintered cutting insert blanks were resintered in vacuum at a temperature of 1483 degrees Centigrade for a duration of about forty-five minutes.

Figure 7:
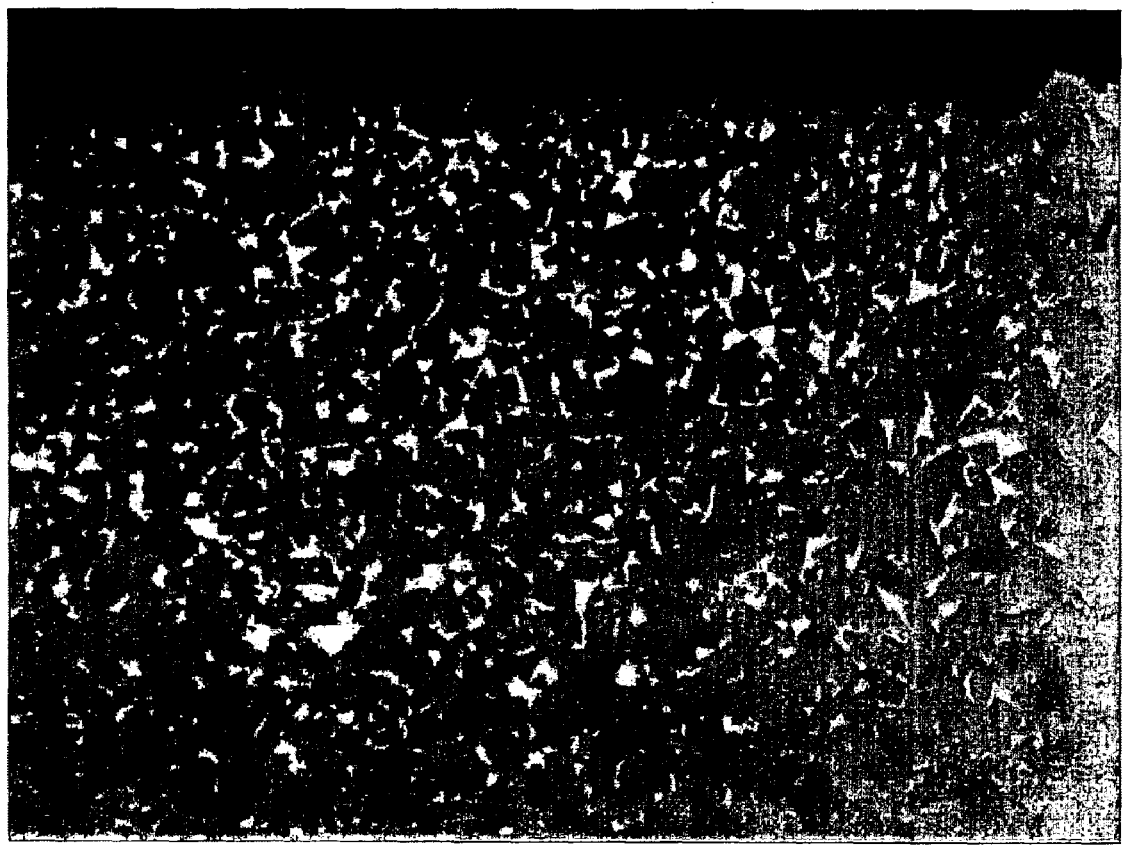
FIG. 7 is a photomicrograph (at a magnification of 1500×) showing the microstructure near the surface of the as-sintered cutting insert substrate made according to Example No. 6 hereof.

The resultant product was a resintered ground cutting insert substrate with ground surfaces. The resintered ground cutting insert substrate has a zone of essentially non-stratified binder enrichment that began at and extended inwardly from the periphery of the ground surface for a depth of about thirty micrometers. The maximum level of cobalt concentration in the zone of binder enrichment was between about 200 percent and about 250 percent. Referring to FIG. 7, the photomicrograph shows that the porosity rating for the zone of binder enrichment was C00 and for the bulk substrate was C02.

EXAMPLE 1057A THROUGH EXAMPLE 1059C

Additional Examples 1057A-C, Examples 1058A-C, and Examples 1059A-C were prepared with the starting powder like Example 1 wherein the carbon levels for Examples 1057A-C, 1058A-C and 1059A-C were 6.24, 6.21, and 6.18 weight percent, respectively.

For Examples 1057A, 1057B, 1058A, 1058B, 1059A, and 1059B, the processing comprised the following steps: dewaxing step of heating at a rate of 2.78 degrees Centigrade per minute to 450 degrees Centigrade in an atmosphere having a hydrogen positive pressure; sinter heating from 450 to 1483 degrees Centigrade in an atmosphere having either a 15 torr nitrogen partial pressure (for Examples 1057-59A) or a 70 torr nitrogen partial pressure (for Examples 1057-59B); sinter holding for 45 minutes at 1483 degrees Centigrade in an atmosphere having a 15 torr nitrogen partial pressure; controlled cooling at a rate of 11.1 degrees Centigrade per minute from 1483 to 1149 degrees Centigrade in an atmosphere having a 15 torr nitrogen partial pressure; and furnace cooling to ambient temperature. The processing was the same, except that Examples 1057-59A performed the sinter heat step in an atmosphere with a 15 torr nitrogen partial pressure and Examples 1057-59B were performed in an atmosphere with a 70 torr nitrogen partial pressure. Each one of Examples 1057A-1059B had a core porosity of C00. Table I below sets forth the depth (in micrometers) from the surface of the zone of non-stratified binder enrichment.

TABLE I

Depth of Zone of Binder Enrichment for Examples 1057A through 1059B

| Example | 1057A | 1058A | 1059A | 1057B | 1058B | 1059B |
|---|---|---|---|---|---|---|
| Depth ($\mu$m) | 15 | 16 | 15 | 22 | 24 | 23 |

Table I shows that when the sinter heat step was performed in an atmosphere, with a higher nitrogen partial pressure (70 torr vs. 15 torr) there was an increase in the average depth of the zone of binder enrichment (23 micrometers vs. 15.7 micrometers).

Examples 1057C, 1058C and 1059C were processed in the same way as Examples 1057B through 1059B, except that the dewaxing occurred in an atmosphere with a hydrogen partial pressure and the controlled cooling step occurred at a rate of 0.94 degrees Centigrade per minute. Table II below presents the depth of binder enrichment in micrometers and the porosity of the bulk substrate. The results in Table II show that while these differences in these parameters did not change the depth of binder enrichment, they did result in the stabilization of the bulk substrate with C-type porosity that formed during the dewaxing step under the hydrogen partial pressure.

TABLE II

Porosity and Depth of Enrichment for Examples 1057B–1059C

| Example | 1057B | 1058B | 1059B | 1057C | 1058C | 1059C |
|---|---|---|---|---|---|---|
| Depth of Enrichment ($\mu$m) | 22 | 24 | 23 | 24 | 22 | 23 |
| Core Porosity | C00 | C00 | C00 | C04 | C02 | C02 |

EXAMPLES TC1198 THROUGH TC 1211

Six additional examples (TC1209, TC1211, TC1205, TC1207, TC1198 and TC1200) of cutting inserts were made and performance tested against commercial cutting inserts. For each one of the examples, the starting powders were the same as Example 1 wherein the carbon levels were adjusted as set forth in Table III below.

TABLE III

Compositional and Performance Properties of Examples TC1198–TC1211

| Example/Component | TC1209 | TC1211 | TC1205 | TC1207 | TC1198 | TC1200 |
|---|---|---|---|---|---|---|
| Carbon Content (wt. %) | 6.0579 | 6.0766 | 6.0954 | 6.1142 | 6.1330 | 6.1517 |
| Core Porosity | C00 | C00 | C02 | C02 | C02 | C04 |
| Depth of Enrichment ($\mu$m) | 31 | 31 | 29 | 30 | 33 | 32 |
| Avg. Tool Life (450 sfm) | 306 | 339 | 412 | 434 | 492 | 545 |
| Avg. Tool Life (750 sfm) | 484 | 468 | 485 | 381 | 569 | 526 |

The above powder mixtures were pressed into green cutting insert blanks that were of a CNMG432-MG style cutting inserts. The green cutting insert blanks had a partial density of about fifty-five percent and had open porosity.

All of the green compacts were processed according to the following steps: (1) a two part dewaxing step that comprised: (a) heating from 18 degrees Centigrade to 400 degrees Centigrade at a rate of 2.78 degrees Centigrade per minute under a hydrogen partial pressure of hydrogen and holding at 400 degrees Centigrade for one hundred twenty minutes, and (b) heating from 400 degrees Centigrade 510 degrees Centigrade at a rate of 2.78 degrees Centigrade per minute under a hydrogen partial pressure and holding for one hundred twenty minutes; (2) a sinter heat step that comprised heating from 510 degrees Centigrade to 1470 degrees Centigrade at a rate of 2.78 degrees Centigrade per minute under a nitrogen partial pressure of 70 torr; (3) a sinter hold step at 1470 degrees Centigrade for ninety minutes under a nitrogen partial pressure of 15 torr; (4) a controlled cooling step from 1470 degrees Centigrade to 1150 degrees Centigrade at a rate of 0.94 degrees Centigrade per minute under a nitrogen partial pressure of 15 torr; and (5) furnace cooling from 1150 degrees Centigrade to 38 degrees Centigrade under a helium partial pressure; and (6) coating via CVD the substrates so as to have an inner layer of titanium carbonitride that was 4.5 micrometers thick, a mediate layer of alumina that was 8.5 micrometers thick, and an outer layer of titanium carbonitride/titanium nitride that was 1.5 micrometers thick. Table III above sets forth the thickness of the zone of binder enrichment in micrometers from a peripheral flat surface of the substrate as determined from a visual observation, and the porosity of the bulk substrate, i.e., core porosity.

Table IV above sets forth the results of slotted steel bar testing for the Examples set out therein. Table IV presents the average tool life in minutes for a slotted steel bar turning test performed according to a first set of parameters, and the average tool life in minutes for a slotted steel (AISI 41L50) bar turning test performed according to a second set of parameters. The first test parameters comprise a speed of 450 surface feet per minute. The feed was started at 0.015 inches per revolution (ipr) and was increased to 0.050 ipr in increments of 0.005 inches per 100 impacts. The depth of cut was 0.100 inches. The turning was dry. The second test parameters comprise a speed of 750 surface feet per minute. The feed started at 0.015 inches per revolution (ipr) and was increased to 0.050 ipr in increments of 0.005 ipr per 100 impacts. The depth of cut was 0.100 inches. The turning was dry.

Table IV also sets forth the performance results for the two commercial grades identified for the purposes of these tests as KMT A and KMT B. For the KMT A cutting insert, the substrate exhibited a zone of non-stratified cobalt (binder) enrichment of a depth of about twenty-five micrometers with a maximum cobalt content of about two hundred percent of the bulk cobalt content, and had a bulk porosity of A00-B00-C00. The coating scheme for the KMT A cutting insert comprised: a base layer of titanium carbonitride that was about two micrometers thick, an intermediate layer of titanium carbide that was about four micrometers thick, and an outer layer of alumina that was about 1.5 micrometers thick wherein all three layers were applied by CVD techniques.

For the KMT B cutting insert, the substrate exhibited a zone of stratified binder enrichment of a depth of twenty micrometers with a maximum cobalt content of about three hundred percent of the bulk content, and had a bulk porosity of C04 to C06. The coating scheme for the KMT B cutting insert comprised: a base layer of titanium carbide that was 4.5 micrometers thick, an intermediate layer of titanium carbonitride that was 3.5 micrometers thick, and an outer layer of titanium nitride that was 3 micrometers thick wherein all of the layers were applied by CVD techniques.

Table IV below sets forth the tool life and failure mode for Examples TC1209, TC1211, TC1205, TC1207, TC1198, and TC1200. Table IV presents the bulk substrate porosity, the results in minutes and tool life criteria for each of three separate runs, and the average tool life in minutes. The turning test was performed on a AISI 4340 steel workpiece at a speed of 500 surface feet per minute, a feed of 0.014 inches per revolution, a depth of cut of 0.100 inches, and turning was done dry, i.e., no coolant. Tool life criteria comprised flank wear (fw) of 0.015 inches; maximum flank wear (mfw) of 0.030 inches; nose wear (nw) of 0.030 inches; depth of cut notch (dn) of 0.030 inches; and crater wear depth (cr) of 0.004 inches.

TABLE IV

Test Results from Turning Test on AISI 4340 Steel Workpiece

| Example | Bulk Porosity | Run 1 (minutes) | Run 2 (minutes) | Run 3 (minutes) | Tool Life Average (minutes) |
|---|---|---|---|---|---|
| TC1209 | C00 | 36.1 nw-cr | 35.0 nw | 31.8 nw | 34.3 |
| TC1211 | C00 | 35.6 fn-nw | 30.6 nw | 30.9 nw | 32.4 |
| TC1205 | C02 | 35.0 nw | 31.0 nw | 30.1 nw | 32.0 |
| TC1207 | C02 | 37.7 nw | 36.1 nw | 30.5 nw | 34.8 |
| TC1198 | C04 | 29.4 nw | 32.2 mw | 30.2 nw | 30.6 |
| TC1200 | C06 | 30.1 nw-cr | 30.2 nw | 25.8 nw | 28.7 |
| KMT A | A00/B00 | 19.4 cr | 20.3 nw | 20.1 nw | 19.9 |
| KMT B | C08 Min | 17.7 cr | 16.4 nw | 18.0 nw | 17.4 |

EXAMPLES TC1247A THROUGH TC1247C

Additional Examplls TC1247A through TC1247C, TC1248A through TC1248C, and TC1249A through TC1249C were prepared wherein the starting powder mixture contained the following components (in weight percent): 6.0 cobalt, 2.59 tantalum, 2.00 titanium, 0.91 niobium, and the balance tungsten and carbon wherein the carbon levels were adjusted so that Examples TC1247A-C, TC1248A-C and TC1249A-C had carbon levels of 6.15, 6.10 and 6.07 weight percent, respectively. The starting powder mixture contained 0.63 weight percent titanium nitride, which contributed 0.5 weight percent of the titanium content, so that an effective amount of nitrogen was in the starting powder mixture for these examples.

The processing of these examples comprised the steps of: a two-stage dewaxing step in a hydrogen partial pressure comprising heating at a ramp rate of 5.36 degrees Centigrade per minute from ambient temperature to 400 degrees Centigrade, then holding for 30 minutes, then heating from 400 to 510 degrees Centigrade at a ramp rate of 5.36 degrees Centigrade, and then holding for 15 minutes; a sinter heating step of heating from 510 to 1468 degrees Centigrade in an atmosphere with a nitrogen partial pressure of 70 torr; a sinter hold step of holding at 1468 degrees Centigrade under an atmosphere having a nitrogen partial pressure of either 15 torr (Examples TC1247A, TC1248A and TC1249A), 45 torr (Examples TC1247B, TC1248B, and TC1249B) or 70 torr (Examples TC1247C, TC1248 C and TC1249C); a controlled cooling step of cooling at a rate of 0.94 degrees Centigrade per minute from 1468 to 1149 degrees Centigrade (a temperature below the eutectic temperature) under an atmosphere having a nitrogen partial pressure of either 15 torr (Examples TC1247A, TC1248A and TC1249A), 45 torr (Examples TC1247B, TC1248B and TC1249B) or 70 torr (Examples TC1247C, TC1248C, and TC1249C); and a furnace cooling step under a helium atmosphere of cooling from 1149 degrees Centigrade to ambient temperature.

Table V below sets forth the carbon content in weight percent of the starting powder mixture, the nitrogen partial pressure (in torr) in the sinter holding step, the depth of the zone of binder enrichment in micrometers, and the porosity of the bulk substrate for Examples TC1247, TC1248 and TC1249.

TABLE V

Properties of Examples TC1247-49

| Example/Starting Carbon Content/Nitrogen Partial Pressure in Sinter Hold Step | Depth of Zone of Binder Enrichment ($\mu$m) | Core Porosity |
|---|---|---|
| TC1247A/6.15/15 torr | 57 | A04-B00-C06 |
| TC1247B/6.15/45 torr | 46 | A04-B00-1-C06 |
| TC1247C/6.15/70 torr | 39 | A04-B00-C06 |
| TC1248A/6.10/15 torr | 54 | A02-B00-C05 |
| TC1248B/6.10/45 torr | 43 | A02-B00-1-C04 |
| TC1248C/6.10/70 torr | 32 | A02-B00-C05 |
| TC1249A/6.07/15 torr | 49 | A02-B00-1-C02 |
| TC1249B/6.07/45 torr | 35 | A02-B00-1-C02 |
| TC1249C/6.07/70 torr | 28 | A02-B00-1-C02 |

A review of the above results shows that for a starting powder mixture that contains some nitrogen, the greater the nitrogen partial pressure during the sinter hold step results in a decrease in the depth of the zone of binder enrichment. These results also show that the porosity of the bulk substrate remains generally consistent even though the sinter hold step occurred at different nitrogen partial pressures. Finally, these results show that the carbon level of the starting powder mixture impacts upon the depth of the zone of binder enrichment.

Examples TC1247D, TC1248D, TC1249D, which had the same composition of the starting powder mixture as Examples TC1247A, TC1248A, and TC1249A, respectively, were processed according to the following steps (1) a dewaxing step comprising heating in a hydrogen partial pressure (e.g., 5 to 30 torr) from ambient temperature to 593 degrees Centigrade and holding for 15 minutes; (2) sinter heating in a vacuum (75 microns or less) from 593 to 1121 degrees Centigrade and holding for 10 minutes; (3) sinter heating still in a vacuum from 1121 to 1288 degrees Centigrade and holding for 10 minutes; (4) sinter heating under 15 torr argon atmosphere from 1288 to 1482 degrees Centigrade; (5) sinter holding in a 15 torr argon atmosphere for 45 minutes at 1482 degrees Centigrade; and (6) cooling from 1482 degrees Centigrade to 52 degrees Centigrade at a cooling rate of 277 degrees Centigrade per minute. Table VI sets forth the carbon level in weight percent in the starting powder, the depth of zone of binder enrichment in micrometers, and the bulk porosity.

TABLE VI

Properties of Examples 1247D-1249D

| Example | Carbon Level (wt. %) | Depth of Zone of Binder Enrichment ($\mu$m) | Porosity |
|---|---|---|---|
| TC1247 | 6.15 | 18 | A04-B00-(>>C08) |
| TC1248 | 6.10 | 16 | A04-B00-1-C05 |
| TC1249 | 6.07 | 16 | A02-B00-2-C00 |

These results show that when the processing includes a vacuum then the depth of the zone of binder enrichment becomes less than when processed under an atmosphere with a nitrogen partial pressure.

A heat of 5821 cutting insert blanks of the same composition, but of various geometries and sizes, was run to determine the consistency of enrichment and the porosity of the bulk substrate for blanks at different locations in the heat. The composition of the starting powder mixture contained the following components: 6.00 weight percent cobalt, 2.61 weight percent tantalum, 2.00 weight percent titanium, 0.88 weight percent niobium, and the balance tungsten and carbon wherein the carbon level was adjusted to equal to 6.13 weight percent. The process comprised steps to make the substrate like those set for Examples TC1198–TC1211.

A sampling of as-sintered cutting insert substrates from various locations throughout the heat showed that the depth of binder enrichment only varied between twenty-three and twenty-six micrometers and the porosity of the bulk substrate only varied between A00-B00-C04 and A00-B00-C06. The consistency of these properties for as-sintered cutting insert substrates taken from various locations throughout the entire heat was excellent.

For the above examples set forth in this patent application the compositions of the starting powder mixtures were expressed in terms of the weight percent of the component elements. However, in practice it would be typical that some of the elements would be present in powders of compounds. For example, a tungsten-titanium carbide powder would make a contribution of tungsten, titanium and carbon to the powder mixture, a tantalum-niobium carbide would make a contribution of tantalum, niobium and carbon to the powder mixture, and a cemented (cobalt) tungsten carbide powder would make a contribution of tungsten, cobalt and carbon to the powder mixture.

As mentioned hereinabove, applicants believe that the presence of nitrogen in the bulk region of the substrate, as well as in the surface zone of binder enrichment, should provide certain advantages. Applicants do not intend to be limited by the following explanation of one possible scientific theory that may have application to a process that produces an as-sintered cemented (cobalt) tungsten carbide substrate with a surface zone of essentially non-stratified cobalt enrichment and that applicants believe possesses higher (or desirably high) levels of nitrogen in the bulk region and in the zone of binder enrichment.

It is applicants' belief that to obtain a higher level of nitrogen in the as-sintered substrate, and especially in the surface zone of binder enrichment, a high nitrogen partial pressure should be maintained during the sinter hold step. Such a higher nitrogen partial pressure should prevent, or at least limit, the evolution of nitrogen atoms from the binder (e.g., cobalt).

The nitrogen activity in the cobalt binder of a cemented (cobalt) tungsten carbide can be calculated based upon the following equations:

$$\tfrac{1}{2} N_2(p_{N2}) \Leftrightarrow N(a_N) \tag{1A}$$

$$\Delta G = \Delta G^\circ + RT \ln K \tag{2A}$$

wherein $p_{N2}$ is the nitrogen partial pressure, K is the chemical reaction rate constant, and G is the Gibb's free energy. At equilibrium, when $\Delta G=0$, K is expressed by the equation:

$$K = \exp[-\Delta G^\circ/RT] = a_N/(p_{N2})^{1/2} \tag{3A}$$

At certain sintering temperatures (T), e.g., the temperature of the sinter hold step, the nitrogen activity ($a_N$) is determined by the nitrogen partial pressure. In practice, an increase in the nitrogen activity from $a_1$ to $a_2$ can be determined by an increase in the nitrogen partial pressure from P1 to P2 per the following equation:

$$P2/P1 = (a_2/a_1)^2, \tag{4A}$$

For example, at a constant temperature, to double the nitrogen activity of a treatment, i.e., the $a_2/a_1$ ratio is equal to 2, at a nitrogen partial pressure of 15 torr, one would need to increase the nitrogen partial pressure four-fold to 60 torr so as to satisfy equation (4A).

EXAMPLES X207-1 THROUGH X207-3

For Examples X207-1 through X207-3, the starting powder mixture contained the following components: 6 weight percent cobalt, 2.7 weight percent tantalum, 2.0 weight percent titanium, 0.8 weight percent niobium and the balance of the starting powder mixture was tungsten and carbon. In the starting powder mixture, 2 weight percent of the titanium, i.e., about 100 percent of the titanium, came from titanium nitride in the starting powder mixture so that the starting powder mixture contained an effective amount of nitrogen wherein the nitrogen assisted in the formation of the zone of binder enrichment.

Five kilograms (kg) of the powder mixture charge for Examples X207-1 through X207-3 were added to a 7.5 inch (19.05 centimeters) inside diameter by 9 inch (22.9 centimeters) steel mill jar along with 21 kilograms of 5/16th inch diameter cemented carbide cycloids. Heptane was added to the top of the jar so that the jar was completely full. The mixture was rotated for forty hours at fifty-two revolutions per minute (rpm) at ambient temperature. The slurry from the charge was then emptied from the jar and dried, paraffin added as a fugitive binder, and the powders were granulated so as to provide for adequate flow properties. These granulated powders were then pressed into SNG433 style green cutting (turning) insert blanks, i.e., a compacted mass of starting powders, which exhibited partial density as well as open porosity.

The general process parameters for the production of Examples X207-1 through X207-3 are set forth hereinafter.

For all of the Examples X207-1 through X207-3, the green cutting insert blanks were heated (or dewaxed) under a partial pressure of hydrogen gas from ambient temperature to about 510 degrees Centigrade (950 degrees Fahrenheit) to form dewaxed cutting insert blanks. During the dewaxing step, the fugitive binder evaporated from the green cutting insert blanks. The dewaxed cutting insert blanks were held at about 510 degrees Centigrade for ten minutes in a vacuum.

Following the vacuum-hold step there was a sinter heating (or sinter heat) step in which flowing nitrogen gas was introduced so that the atmosphere had a nitrogen partial pressure (i.e., a sinter heat nitrogen partial pressure [P1] in Table VII) for the entire time that the dewaxed cutting insert blanks were heated at a rate of about 2.78 degrees Centigrade per minute from about 510 degrees Centigrade to the maximum sintering temperature of about 1468 degrees Centigrade. These sinter heat nitrogen partial pressures (P1) were different for the examples, and the specific nitrogen partial pressures, are set forth in Table VII hereinafter. The dewaxed cutting insert blanks were transformed into pre-sintered cutting insert blanks.

A sinter holding step followed the sinter heating step. At the start of the sinter holding step the nitrogen partial pressure was increased, remained the same or reduced to the sinter hold nitrogen partial pressures (P2) as set forth in Table VII and the temperature was maintained at about 1468 degrees Centigrade (2675 degrees Fahrenheit) for a period of about 90 minutes. The pre-sintered cutting insert blanks were transformed into as-sintered cutting insert blanks wherein these blanks exhibited substantially full density.

A controlled cooling step followed the sinter holding step. In the controlled cooling step, the nitrogen partial pressure remained at about 15 torr and the as-sintered cutting insert blanks were cooled at a rate of about 1.0 degrees Centigrade per minute (1.7 degrees Fahrenheit per minute) until reaching a temperature of about 1150 degrees Centigrade (2100 degrees Fahrenheit) which was below the eutectic temperature of about 1315 degrees Centigrade.

The next step was a furnace cooling step under a helium partial pressure in which the as-sintered cutting insert blanks were permitted to furnace cool to ambient temperature 38 degrees Centigrade. The resultant product of the above processing steps was an as-sintered cutting insert substrate.

In addition to the sinter heat nitrogen partial pressure and the sinter hold nitrogen partial pressure (both set forth in torr), Table VII sets forth other properties including the porosity of the bulk region of the substrate, the depth (in micrometers) of the surface zone of binder enrichment, and the maximum level of cobalt in the surface zone of binder enrichment. The maximum level of cobalt in the surface zone of binder enrichment is set forth as a percentage of the cobalt content of the bulk region. The porosity of the bulk region were determined according to ASTM Designation B-276-91 (Reapproved 1996).

TABLE VII

Selected Process Parameters and Properties of Examples Nos. X207-1 through X207-3

| Example/Property | X207-1 | X207-2 | X207-3 |
|---|---|---|---|
| Sinter Heat Nitrogen Partial Pressure [P1] | 15 torr | 15 torr | 70 torr |
| Sinter Hold Nitrogen Partial Pressure [P2] | 70 torr | 15 torr | 15 torr |
| Depth (micrometers) of Zone of Binder Enrichment | 26 $\mu$m | 42 $\mu$m | 65 $\mu$m |
| Maximum Cobalt Content in the Surface Zone of Binder Enrichment | about 210% | about 225% | about 175% |
| Porosity of the Bulk Region | A02-B00-C00 | A02-B00-C00 | A02-B00-C03 |

Referring to Examples X207-1 through X207-3, it is apparent that the depth of the surface zone of binder enrichment can be controlled by selecting the sinter hold nitrogen partial pressure and/or the sinter heat nitrogen partial pressure. Applicants note that binder enrichment still occurs even in the case where the sinter hold nitrogen partial pressure (P2) is over four times as great as the sinter heating nitrogen partial pressure (P1). For examples X207-1 through X207-3, the nature of the binder enrichment in the surface zone is essentially non-stratified binder enrichment.

EXAMPLES 1059-4 THROUGH 1059-6

Examples 1059-4 through 1059-6 had a composition the same as Example 1 hereof, except that the carbon content was adjusted to equal 6.18 weight percent. Examples 1059-4 through 1059-6 were processed in a manner the same as Examples X207-1 through X207-3, respectively. Table VIII sets out the nitrogen partial pressure for the sinter heating step (P1) and the nitrogen partial pressure for the sinter holding step (P2), as well as other properties including the porosity of the bulk region of the substrate, the depth (in micrometers) of the surface zone of binder enrichment, and the maximum cobalt content in the surface zone of binder enrichment. The maximum cobalt content in the surface zone of binder enrichment is set forth is set forth as a percentage of the cobalt content of the bulk region. The porosity of the bulk region were determined according to ASTM Designation B-276-91 (Reapproved 1996).

TABLE VIII

Selected Process Parameters and Properties of Examples Nos. 1059-4 through 1059-6.

| Example/Property | Ex. 1059-4 | 1059-5 | 1059-6 |
|---|---|---|---|
| Sinter Heat Nitrogen Partial Pressure [P1] | 15 torr | 15 torr | 70 torr |

TABLE VIII-continued

Selected Process Parameters and Properties of Examples Nos. 1059-4 through 1059-6.

| Example/Property | Ex. 1059-4 | 1059-5 | 1059-6 |
|---|---|---|---|
| Sinter Hold Nitrogen Partial Pressure [P2] | 70 torr | 15 torr | 15 torr |
| Depth (micrometers) of Zone of Binder Enrichment | None | 16 μm | 22 μm |
| Degree of Enrichment in the Zone of Binder Enrichment | Not applicable | about 180% | about 210% |
| Porosity of the Bulk Region | A02-B00-C00 | A02-B00-C00 | A02-B00-C02 |

Referring to Examples 1059-4 through 1059-6, these examples show that the depth of the zone of cobalt enrichment may be controlled (i.e., varied in a predictable fashion) by adjusting the nitrogen partial pressure in the sinter heating step and/or the sinter holding step. Furthermore, these Examples 1059-4 through 1059-6 demonstrate that as-sintered substrates that exhibit either a surface zone of binder enrichment at least 5 micrometers deep or an absence of a surface zone of binder enrichment can be made from a starting powder with the same composition. Such a feature of the process permits one to only store or make one starting powder mixture to produce two different as-sintered substrates wherein one of the as-sintered substrates has a surface zone of binder enrichment and the other as-sintered substrate does not exhibit a surface zone of binder enrichment.

Examples from Heat 1723 and Heat 1660

The six examples from Heat 1723 are identified in Table IX below. These examples from Heat 1723 were processed in a fashion like Example 1 hereof, except that the nitrogen partial pressure during the sinter heating step was 70 torr, the nitrogen partial pressure during the sinter hold step was 15 torr, and the ramp rate for the heating step was 1.11 degrees Centigrade per minute (2 degrees Fahrenheit per minute). The composition of the examples from Heat 1723 were the same as Example 1 hereof, except that the carbon level for each example was adjusted to the values as set forth in Table IX. Examples TC1206/RH-1723 and TC1199/RH-1723 comprised as-sintered substrates that had at least one surface ground prior to the sintering process. The properties pertaining to the zone of binder enrichment were determined from the ground surface.

Table IX below sets forth the depth of cobalt enrichment in micrometers, the porosity of the bulk region of the substrate was determined according to ASTM Designation B276-91 (Reapproved 1996), the magnetic saturation value (gauss·cm$^3$ per gram), the coercive force ($H_C$) in oersteds, and the density of the material in grams per cubic centimeter.

TABLE IX

Properties of Examples from Heat 1723

| Example/ [wt % carbon] | Depth of Cobalt Enrichment (μm) | Porosity | MS (gauss · cm$^3$ per gram) | $H_C$ (Oersteds) | Density (g/cm$^3$) |
|---|---|---|---|---|---|
| TC1205–1723 [6.0954%] | 40 | A02-C00-1-C01 | 9.5 | 157 | 14.01 |
| TC1207–1723 [6.1142%] | 43 | A02-B00-C02 | 9.4 | 162 | 14.01 |
| TC1198–1723 [6.1330%] | 40 | A02-B00-1-C03 | 9.6 | 151 | 13.99 |
| TC1200–1723 [6.1517%] | 40 | A02-B00-(C03) C05 | 9.6 | 149 | 13.98 |
| TC1206/RH-1723 | 45 | A02-B00-C03 | 9.5 | 147 | 13.99 |
| TC1199/RH-1723 | 43 | A02-B00-C05 | 9.5 | 151 | 13.98 |

[P1 = 70 torr; P2 = 15 torr; sinter heat ramp rate = 1.11 degrees Centigrade per minute]

The six examples from Heat 1660 were processed like the Examples from Heat 1723, except that the ramp rate for the sinter heating step was at a faster rate of 2.78 degrees Fahrenheit (5 degrees Centigrade) per minute. Examples TC1206/RH-1660 and TC1199/RH-1660 comprised as-sintered substrates that had at least one surface ground prior to the sintering process. The properties pertaining to the zone of binder enrichment were determined from the ground surface. Table X below sets forth the depth of cobalt enrichment in micrometers, the porosity of the bulk region of the substrate according to ASTM Designation B276-91 (Reapproved 1996), the magnetic saturation value (gauss·cm³ per gram), the coercive force ($H_C$) in oersteds, and the density of the material in grams per cubic centimeter.

Examples from Heat 1724

The six examples from Heat 1724 were processed in a fashion like the examples from Heat 1660, except that the nitrogen partial pressure during the sinter hold step was 1.5 torr. Examples TC1206/RH-1724 and TC1199/RH-1724 comprised as-sintered substrates that had at least one surface ground prior to the sintering process. The properties pertaining to the zone of binder enrichment were determined from the ground surface. Table XI below sets forth the depth of cobalt enrichment in micrometers, the porosity of the bulk substrate according to ASTM Designation B276-91 (Reapproved 1996), the magnetic saturation value (gauss·cm³ per gram), the coercive force ($H_C$) in oersteds, and the density of the material in grams per cubic centimeter.

TABLE X

Properties of Examples from Heat 1660

| Example/ [wt % carbon] | Depth of Cobalt Enrichment (μm) | Porosity | MS (gauss · cm³ per gram) | $H_C$ (Oersteds) | Density (g/cm³) |
|---|---|---|---|---|---|
| TC1205–1660 [6.0954%] | 29 | C00 | 9.5 | 159 | 14.00 |
| TC1207–1660 [6.1142%] | 30 | (C02) C03 | 9.5 | 158 | 14.00 |
| TC1198–1660 [6.1330%] | 33 | (C03) C05 | 9.7 | 153 | 13.98 |
| TC1200–1660 [6.1517%] | 32 | (C05) C06 | 9.7 | 150 | 13.96 |
| TC1206/RH-1660 | 32 | C02 | 9.4 | 165 | 14.01 |
| TC1199/RH-1660 | 33 | C05 | 9.6 | 158 | 13.98 |

Referring to the examples from Heat 1723 and Heat 1660, it becomes apparent that the ramp rate during the sinter heating step impacts upon the depth of binder enrichment when the sinter heating step occurs in a nitrogen partial pressure. For all of the examples, the depth of the cobalt enrichment increased with the slower ramp rate (1.11 degrees Centigrade per minute vs. 2.78 degrees Centigrade per minute) during the sinter heating step.

TABLE XI

Properties of Examples from Heat 1724

| Example/ [wt % carbon] | Depth of Cobalt Enrichment (μm) | Porosity | MS (gauss · cm³ per gram) | $H_C$ (Oersteds) | Density (g/cm³) |
|---|---|---|---|---|---|
| TC1205–1724 [6.0954%] | 43 | A02-B00-C0 | 9.2 | 156 | 14.04 |
| TC1207–1724 [6.1142%] | 43 | A02-C00-C00 | 8.9 | 162 | 14.05 |
| TC1198–1724 [6.1330%] | 39 | A02-B00-1-(C02) C03 | 9.0 | 155 | 14.02 |
| TC1200–1724 [6.1517%] | 43 | A02-B00-C03 | 9.2 | 150 | 14.00 |
| TC1206/RH-1724 | 57 | A02-B00-C03 | 8.9 | 148 | 14.03 |
| TC1199/RH-1724 | 60 | A02-B00-1-C03 (C05) | 8.9 | 151 | 14.02 |

A comparison of the examples from Heat 1724 to the Examples from Heat 1660 shows that the depth of the zone of binder enrichment can be increased with a decrease in the nitrogen partial pressure during the sinter hold step.

Overall, it is apparent that applicants have invented a new and useful process for the production of a cutting insert, as well as the cutting insert itself. By making a calculation of the equilibrium nitrogen partial pressure at various temperatures, applicants can control the depth of the zone of binder enrichment that forms in a cemented carbide as-sintered cutting insert substrate. Applicants can also avoid the precipitation of carbon in the zone of binder enrichment through the use of a controlled cooling step. Applicants can also provide for a cutting insert substrate with a consistent bulk porosity.

By calculating the nitrogen activity in the sinter heating step and the sinter holding step, applicants can control the depth of the zone of binder enrichment. Applicants further believe that one can control (e.g., increase) the nitrogen content in as-sintered substrate including in the bulk region and the zone of binder enrichment. An as-sintered substrate that has a desirably high nitrogen content has nitrogen atoms present at the interstices of the cobalt atoms that should facilitate solid-solution hardening, especially for a substrate that with the bulk region that exhibits a porosity of greater than C00 according to ASTM Designation B276-91 (Reapproved 1996).

It is believed that an as-sintered substrate that has bulk region with a porosity of not greater than C00 according to ASTM Designation B276-91 (Reapproved 1996) and a zone of binder enrichment with a desirably high nitrogen content helps promote the nucleation of titanium nitride during the application of titanium nitride as the layer on the surface of the substrate. An as-sintered substrate that has bulk region with a porosity of greater than C00 according to ASTM Designation B276-91 (Reapproved 1996) and a zone of binder enrichment with a desirably high nitrogen content should help promote the nucleation of titanium carbonitride during the application of titanium carbonitride as the layer on the surface of the substrate.

It is believed that by providing additional nitrogen in the cobalt binder there should be an increase in the chemical affinity between the substrate and the nitrogen-containing coating, such as, for example, titanium nitride or titanium carbonitride. An increase in the availability of nitrogen in the cobalt near the surface of the substrate should reduce the potential for the formation of a brittle eta phase at the interface between the coating and the substrate.

It is believed that a higher nitrogen content in the substrate also should result in a decrease in the grains size of the tungsten carbide. An increase in the N/(C+N) content should lead to a decrease in the grain size of the tungsten carbide. The tungsten carbide phase content in the microstructure should increase to a maximum as the N/(C+N) ratio increases.

All patents, patent applications, articles and other documents identified herein are hereby incorporated by reference herein.

Other embodiments of the invention may be apparent to those skilled in the art from a consideration of the specification or the practice of the invention disclosed herein. It is intended that the specification and any examples set forth herein be considered as illustrative only, with the true spirit and scope of the invention being indicated by the following claims.

What is claimed is:

1. A coated cutting insert comprising:
   a substantially fully dense substrate made by sintering a compacted mass of starting powders in an atmosphere containing a nitrogen partial pressure, and the starting powders including the following components: a binder selected from one or more of cobalt, nickel, iron and their alloys wherein the binder is present between about 3 weight percent and about 12 weight percent, up to about 95 weight percent tungsten, up to about 7 weight percent carbon, and up to about 13 weight percent of one or more of the following components: titanium, tantalum, niobium, hafnium, zirconium, and vanadium;
   the substrate having a rake surface and a flank surface, a cutting edge being at the intersection of the rake and flank surfaces;
   the substrate having a zone of non-stratified binder enrichment of a generally uniform depth beginning adjacent to and extending inwardly from the cutting edge and at least one of the rake surface and the flank surface toward a bulk region;
   the zone of binder enrichment having a first nitrogen content, and the bulk region of the substrate having a second nitrogen content, and the first nitrogen content being greater than the second nitrogen content; and
   a coating on the cutting edge and at least a portion of one or both of the rake surface and the flank surface of the substrate.

2. The coated cutting insert of claim 1 wherein the bulk region of the substrate having a porosity according to ASTM Designation B276-91 (Reapproved 1996) between equal to or greater than C02 and equal to or less than C08.

3. The coated cutting insert of claim 1 wherein the starting powders comprising a compound containing titanium and nitrogen contributing up to about 0.5 weight percent titanium to the starting powders.

4. The coated cutting insert of claim 1 wherein the starting powders comprising a compound containing titanium and nitrogen contributing greater than about 0.5 weight percent and up to about 2 weight percent titanium to the starting powders.

5. The coated cutting insert of claim 1 wherein the starting powders comprising a compound containing titanium and nitrogen contributing up to about 25 percent of the titanium in the starting powders.

6. The coated cutting insert of claim 1 wherein the starting powders comprising a compound containing titanium and nitrogen contributing between greater than about 25 percent and up to about 100 percent of the titanium in the starting powders.

7. The coated cutting insert of claim 1 wherein the zone of binder enrichment extending inwardly from the cutting edge and at least one of the rake surface and the flank surface a depth up to about 50 micrometers.

8. The coated cutting insert of claim 1 wherein the zone of binder enrichment extending inwardly from the cutting edge and at least one of the rake surface and the flank surface a depth ranging between about 20 micrometers and about 30 micrometers.

9. The coated cutting insert of claim 1 wherein the binder content of the zone of cobalt enrichment being between about 125 percent and about 300 percent of the binder content of the bulk region.

10. The coated cutting insert of claim 1 wherein the binder content of the zone of cobalt enrichment being between about 200 percent and about 250 percent of the binder content of the bulk region.

11. The coated cutting insert of claim 1 wherein the sintering process comprises a sinter heating step to a temperature above the pore closure temperature, a sinter holding step at a temperature above the pore closure temperature, and a controlled cooling step to a temperature below the eutectic temperature.

12. The coated cutting insert of claim 1 wherein the bulk region of the substrate containing nitrogen wherein the sole source of the nitrogen being the sintering atmosphere.

13. The coated cuffing insert of claim 1 wherein the bulk region of the substrate containing nitrogen wherein the sources of the nitrogen comprising the sintering atmosphere and the starting powders.

14. The coated cutting insert of claim 1 wherein the substrate comprising solid solution carbides and/or solid solution carbonitrides of tungsten and one or more of tantalum, niobium, titanium, hafnium, zirconium, and vanadium.

15. The coated cutting insert of claim 14 wherein the zone of binder enrichment being at least partially depleted of the solid solution carbides and/or solid solution carbonitrides.

16. The coated cutting insert of claim 14 wherein the zone of binder enrichment being completely depleted of the solid solution carbides and/or solid solution carbonitrides.

17. The coated cutting insert of claim 1 wherein the zone of binder enrichment begins at the cutting edge and at least one of the rake surface and flank surface.

18. The coated cutting insert of claim 1 wherein the zone of binder enrichment begins near the cutting edge and at least one of the rake surface and the flank surface.

19. The coated cutting insert of claim 1 wherein the coating comprises one or more layers, and the layers being applied by one or more of physical vapor deposition, chemical vapor deposition, and moderate temperature vapor deposition; and each one of the coating layers comprising one or more of the following: titanium carbide, titanium nitride, titanium carbonitride, alumina, titanium diboride, and titanium aluminum nitride.

20. The coated cutting insert of claim 1 wherein the substrate comprising solid solution carbides and/or solid solution carbonitrides of tungsten and one or more of tantalum, niobium, titanium, hafnium, zirconium, and vanadium; and the zone of binder enrichment being at least partially depleted of the solid solution carbides and/or solid solution carbonitrides.

21. The coated cutting insert of claim 1 wherein the bulk region of the substrate having a porosity according to ASTM Designation B276-91 (Reapproved 1996) being not greater than C00.

22. The coated cutting insert of claim 21 wherein the coating including a base layer of titanium nitride on the surface of the substrate.

23. The coated cutting insert of claim 1 wherein the bulk region of the substrate having a porosity according to ASTM Designation B276-91 (Reapproved 1996) being greater than C00.

24. The coated cutting insert of claim 23 wherein the coating including a base layer of titanium carbonitride on the surface of the substrate.

25. The coated cutting insert of claim 1 wherein the zone of cobalt enrichment extending from the rake surface and the cutting edge, and there being an absence of cobalt enrichment extending from the flank surface.

26. The coated cutting insert of claim 25 wherein the flank surface being a ground surface.

27. A substantially fully dense substrate made by sintering a compacted mass of starting powders in an atmosphere containing a nitrogen partial pressure, and the starting powders including the following components: a binder selected from one or more of cobalt, nickel, iron and their alloys wherein the binder is present between about 3 weight percent and about 12 weight percent, up to about 95 weight percent tungsten, up to about 7 weight percent carbon, and up to about 13 weight percent of one or more of the following components: titanium, tantalum, niobium, hafnium, zirconium, and vanadium, the substrate comprising:

a rake surface and a flank surface, a cutting edge being at the intersection of the rake and flank surfaces;

the substrate having a zone of non-stratified binder enrichment of a generally uniform depth beginning adjacent to and extending inwardly from the cutting edge and at least one of the rake surface and the flank surface toward a bulk region;

the zone of binder enrichment having a first nitrogen content, and the bulk region of the substrate having a second nitrogen content, and the first nitrogen content being greater than the second nitrogen content; and a coating on the cutting edge and at least a portion of one or both of the rake surface and the flank surface of the substrate.

28. The substrate of claim 27 wherein the cutting edge being a honed cutting edge.

29. The substrate of claim 27 wherein the zone of cobalt enrichment being essentially free of any solid solution carbides and any solid solution carbonitrides so that tungsten carbide and cobalt comprise substantially all of the zone of cobalt enrichment.

30. The substrate of claim 27 wherein the bulk region of the substrate having a porosity according to ASTM Designation B276-91 (Reapproved 1996) between equal to or greater than C02 and equal to or less than C08.

* * * * *